US 12,490,426 B2

(12) United States Patent
Ryu et al.

(10) Patent No.: US 12,490,426 B2
(45) Date of Patent: Dec. 2, 2025

(54) SEMICONDUCTOR MEMORY DEVICE AND MANUFACTURING METHOD THEREOF

(71) Applicant: SK hynix Inc., Icheon-si (KR)

(72) Inventors: Seung Wook Ryu, Yongin-si (KR); Ki Hong Lee, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 20 days.

(21) Appl. No.: 18/184,532

(22) Filed: Mar. 15, 2023

(65) Prior Publication Data

US 2023/0217652 A1     Jul. 6, 2023

Related U.S. Application Data

(63) Continuation of application No. 16/883,721, filed on May 26, 2020, now Pat. No. 11,637,114.

(30) Foreign Application Priority Data

Dec. 6, 2019  (KR) .......................... 10-2019-0161366

(51) Int. Cl.
*H10B 41/27* (2023.01)
*H10B 43/27* (2023.01)
*H10B 63/00* (2023.01)

(52) U.S. Cl.
CPC ............. *H10B 41/27* (2023.02); *H10B 43/27* (2023.02); *H10B 63/34* (2023.02)

(58) Field of Classification Search
None
See application file for complete search history.

(56) References Cited

U.S. PATENT DOCUMENTS

| | | |
|---|---|---|
| 8,877,590 B1 | 11/2014 | Lee |
| 9,831,266 B2 | 11/2017 | Kai et al. |
| 10,559,591 B2 | 2/2020 | Kanamori et al. |
| 2015/0155296 A1 | 6/2015 | Yoon |
| 2015/0333143 A1 | 11/2015 | Meldrim et al. |
| 2017/0162594 A1 | 6/2017 | Ahn |
| 2017/0207226 A1 | 7/2017 | Lee |
| 2018/0138195 A1 | 5/2018 | Lee |
| 2018/0366486 A1 | 12/2018 | Hada et al. |
| 2018/0374866 A1 | 12/2018 | Makala et al. |
| 2019/0157294 A1 | 5/2019 | Kanamori et al. |
| 2019/0172906 A1 | 6/2019 | Kim et al. |
| 2019/0288000 A1 | 9/2019 | Choi |
| 2019/0319041 A1 | 10/2019 | Kwak et al. |
| 2019/0333931 A1 | 10/2019 | Jung et al. |
| 2020/0350168 A1 | 11/2020 | Kim et al. |
| 2020/0411536 A1 | 12/2020 | Kim et al. |

(Continued)

FOREIGN PATENT DOCUMENTS

| | | |
|---|---|---|
| CN | 102760739 A | 10/2012 |
| CN | 104835824 A | 8/2015 |
| CN | 105845630 A | 8/2016 |

(Continued)

*Primary Examiner* — Sarah K Salerno
(74) *Attorney, Agent, or Firm* — WILLIAM PARK AND ASSOCIATES LTD.

(57) ABSTRACT

A semiconductor memory device includes a first source layer, a second source layer on the first source layer, a stack structure over the second source layer, and a common source line penetrating the stack structure. The second source layer includes a protective layer in contact with the common source line and a conductive layer surrounding the protective layer.

18 Claims, 20 Drawing Sheets

(56) References Cited

U.S. PATENT DOCUMENTS

2021/0193675 A1  6/2021  Howder et al.

FOREIGN PATENT DOCUMENTS

| | | |
|---|---|---|
| CN | 106856198 A | 6/2017 |
| CN | 107293544 A | 10/2017 |
| CN | 107425005 A | 12/2017 |
| CN | 108063142 A | 5/2018 |
| CN | 109346477 A | 2/2019 |
| CN | 109659308 A | 4/2019 |
| JP | 2002353344 A | 12/2002 |
| KR | 1020180003191 A | 1/2018 |
| KR | 1020190041708 A | 4/2019 |
| KR | 1020190107975 A | 9/2019 |
| KR | 1020190119439 A | 10/2019 |

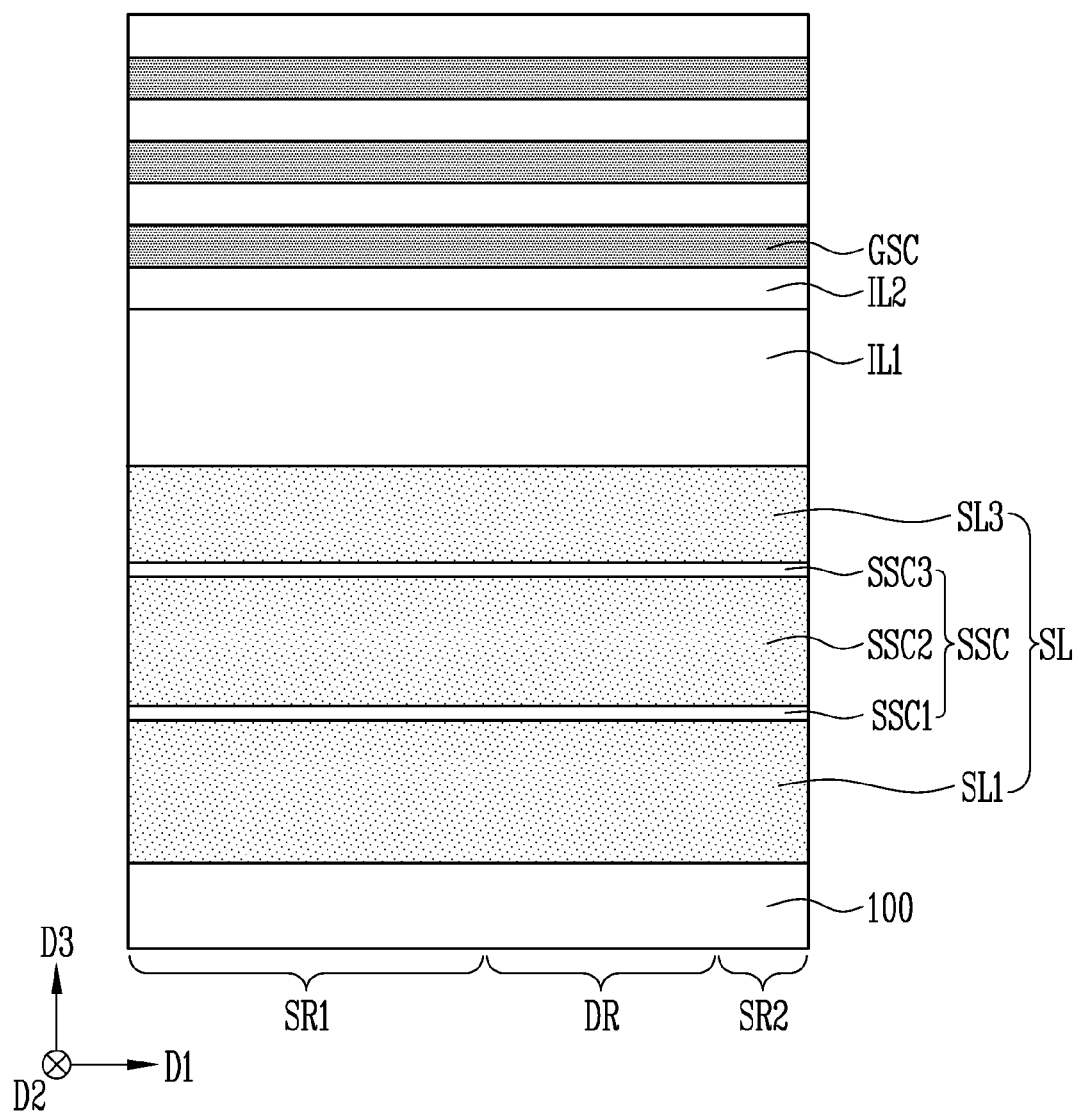

SEMICONDUCTOR MEMORY DEVICE AND MANUFACTURING METHOD THEREOF

CROSS-REFERENCE TO RELATED APPLICATION

The present application is a continuation application of U.S. patent application Ser. No. 16/883,721, filed on May 26, 2020, and claims priority under 35 U.S.C. § 119(a) to Korean patent application number 10-2019-0161366 filed on Dec. 6, 2019, in the Korean Intellectual Property Office, the entire disclosure of which is incorporated herein by reference.

BACKGROUND

1. Technical Field

The present disclosure generally relates to a semiconductor memory device and a manufacturing method thereof, and more particularly, to a three-dimensional semiconductor memory device and a manufacturing method thereof.

2. Related Art

A semiconductor memory device includes memory cells capable of storing data.

According to a method of storing data and a method of retaining data, the semiconductor memory device may be classified as a volatile semiconductor memory device or a nonvolatile semiconductor memory device. A volatile semiconductor memory device is a memory device in which stored data disappears when the supply of power is interrupted, and a nonvolatile semiconductor memory device is a memory device in which stored data is retained even when the supply of power is interrupted.

As portable electronic devices are increasingly used, nonvolatile semiconductor memory devices are increasingly used, and high integration and large capacity semiconductor memory devices are required so as to achieve portability and large capacity. In order to achieve the portability and large capacity, three-dimensional semiconductor memory devices have been proposed.

SUMMARY

In accordance with an aspect of the present disclosure, a semiconductor memory device includes a first source layer, a second source layer on the first source layer, a stack structure over the second source layer, and a common source line penetrating the stack structure. The second source layer includes a protective layer in contact with the common source line and a conductive layer surrounding the protective layer.

In accordance with another aspect of the present disclosure, a semiconductor memory device includes: a stack structure including insulating patterns and gate patterns alternately stacked with each other; a first source layer including a conductive layer and a first protective layer in the conductive layer; a channel structure penetrating the stack structure, the channel structure being connected to the first source layer; and a common source line penetrating the stack structure, the common source line being in contact with the first protective layer.

In accordance with still another aspect of the present disclosure, a semiconductor memory device includes: a first source layer; a second source layer on the first source layer; insulating patterns and gate patterns, over the second source layer; and a channel structure penetrating the insulating patterns, the gate patterns, and the second source layer. The second source layer includes a conductive layer in contact with the channel structure and a protective layer surrounded by the conductive layer.

In accordance with still another aspect of the present disclosure, a method of manufacturing a semiconductor memory device includes: forming a source structure including a source sacrificial structure; forming a stack structure on the source structure; forming a trench penetrating the stack structure; forming a first cavity by removing the source sacrificial structure through the trench; forming a preliminary conductive layer including a first preliminary conductive part in the trench and a second preliminary conductive part in the first cavity; forming a first protective layer in the second preliminary conductive part; and removing the first preliminary conductive part.

In accordance with still another aspect of the present disclosure, a method of manufacturing a semiconductor memory device includes: forming a source sacrificial structure; alternately stacking insulating layers and gate sacrificial layers over the source sacrificial structure; forming a trench penetrating the insulating layers and the gate sacrificial layers; forming a first cavity by removing the source sacrificial structure through the trench; and forming a source layer including a conductive layer in the first cavity and a protective layer in the conductive layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 2A to 2K are sectional views illustrating a manufacturing method of the semiconductor memory device shown in FIGS. 1A and 1B.

DETAILED DESCRIPTION

The specific structural and functional descriptions disclosed herein are merely illustrative for the purpose of describing embodiments according to the concept of the present disclosure. Embodiments according to the concept of the present disclosure can be implemented in various forms, and should not be construed as being limited to the specific embodiments set forth herein.

Some embodiments are directed to semiconductor memory devices capable of improving operational reliability. Other embodiments are directed to a manufacturing method of such semiconductor memory devices.

Figure 1A:
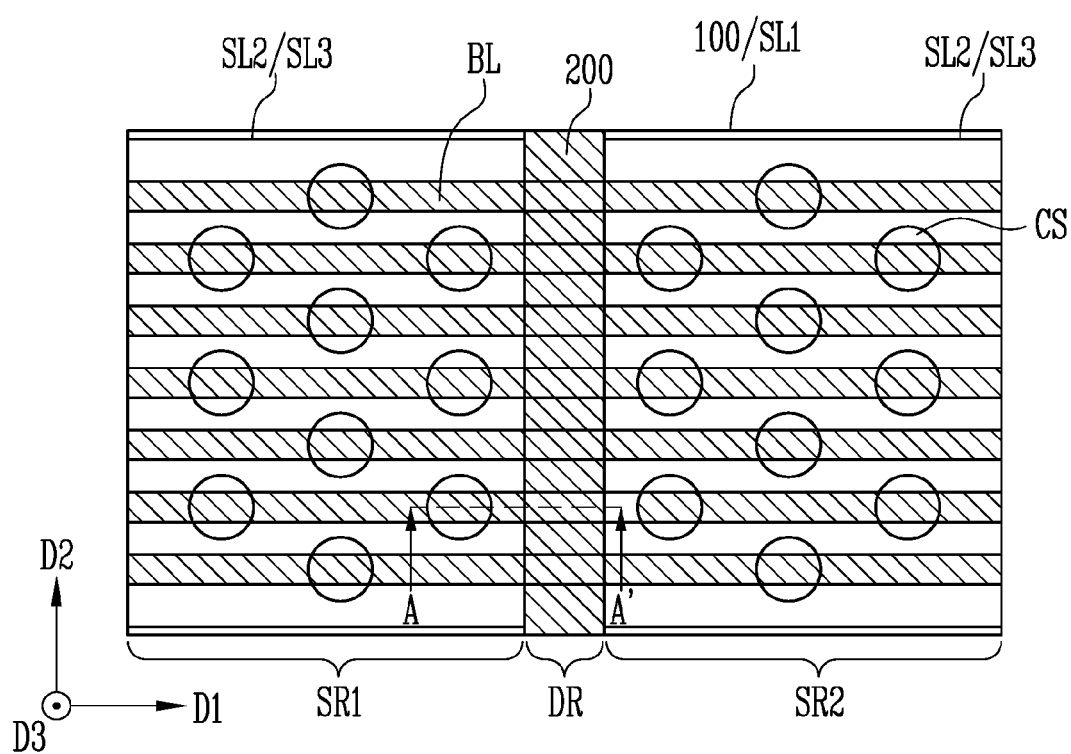
FIG. 1A is a plan view of a semiconductor memory device in accordance with an embodiment of the present disclosure.
Figure 1B:
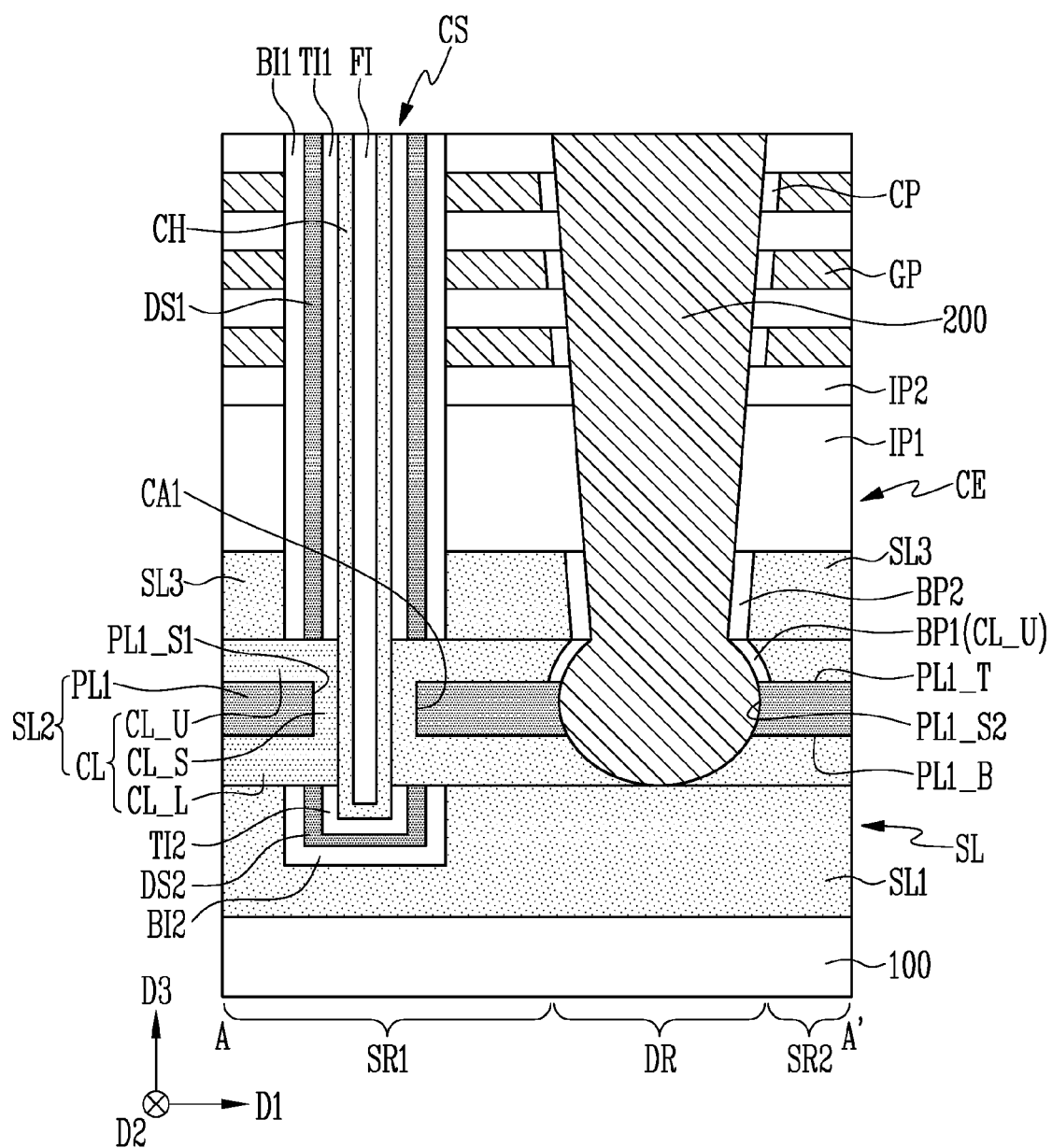
FIG. 1B is a sectional view taken along line A-A' shown in FIG. 1A.

FIG. 1A is a plan view of a semiconductor memory device in accordance with an embodiment of the present disclosure. FIG. 1B is a sectional view taken along line A-A' shown in FIG. 1A.

Referring to FIGS. 1A and 1B, the semiconductor memory device may include a substrate 100. The substrate 100 may have the shape of a plate extending along a plane defined by a first direction D1 and a second direction D2. The substrate 100 may be a single crystalline semiconductor substrate. For example, the substrate 100 may be a bulk silicon substrate, a silicon-on-insulator substrate, a germanium substrate, a germanium-on-insulator substrate, a silicon-germanium substrate, or an epitaxial thin film formed through a selective epitaxial growth process.

The substrate 100 may include a first stack region SR1, a second stack region SR2, and an isolation region DR. The first stack region SR1 and the second stack region SR2 may be spaced apart from each other in the first direction D1 with the isolation region DR interposed therebetween. The isolation region DR may be one of a plurality of slit regions for isolating stack structures from each other.

A source structure SL may be provided on the substrate 100. The source structure SL may include a conductive material.

In an example, as shown in the drawings, the source structure SL may include first to third source layers SL1, SL2, and SL3. In another example, unlike as shown in the drawings, the source structure SL may be configured in a single layer. Hereinafter, although a case where the source structure SL includes the first to third source layers SL1, SL2, and SL3 is described as an example, the structure of the source structure SL is not limited thereto.

Unlike as shown in the drawings, in another embodiment of the present disclosure, a peripheral circuit structure and a connection structure may be provided between the substrate 100 and the source structure SL. The peripheral circuit structure may include NMOS transistors, PMOS transistors, a resistor, and a capacitor. The NMOS transistors, the PMOS transistors, the resistor, and the capacitor may be used as elements constituting a row decoder, a column decoder, a page buffer circuit, and an input/output circuit. The connection structure may include a contact plug and a line.

For convenience of description, a case where the source structure SL is directly provided on the substrate 100 is described in this embodiment. The first source layer SL1 may be provided on the substrate 100. The first source layer SL1 may have the shape of a plate extending along a plane defined by the first direction D1 and the second direction D2. In an example, the first source layer SL1 may include poly-silicon.

The second source layer SL2 may be provided on the first source layer SL1. The third source layer SL3 may be provided on the second source layer SL2. A stack structure CE may be provided on the third source layer SL3. The second and third source layers SL2 and SL3 and the stack structure CE may be provided on the first and second stack regions SR1 and SR2 of the substrate 100. A common source line 200 may be provided on the isolation region DR of the substrate 100. The common source line 200 may penetrate the stack structure CE, the second source layer SL2, and the third source layer SL3.

The common source line 200 may extend in the second direction D2. The common source line 200 may include a conductive material. In an example, a lower portion of the common source line 200 may include poly-silicon, and an upper portion of the common source line 200 may include tungsten.

The second source layer SL2 may have the shape of a plate extending along a plane defined by the first direction D1 and the second direction D2. The second source layer SL2 may include a conductive layer CL and a first protective layer PL1. The conductive layer CL may be connected to the first source layer SL1. The first protective layer PL1 may be provided in the conductive layer CL. In other words, a first cavity CA1 may be formed in the conductive layer CL, and the first protective layer PL1 may fill the first cavity CA1. In other words, the first protective layer PL1 may be surrounded by the conductive layer CL. An upper surface PL1_T, a first sidewall PL1_S1, and a lower surface PL1_B of the first protective layer PL1 may be in contact with the conductive layer CL. A second sidewall PL1_S2 of the protective layer PL1 may be in contact with the common source line 200. The first protective layer PL1 may have the shape of a plate extending along a plane defined by the first direction D1 and the second direction D2. The first protective layer PL1 may include a material having an etch selectivity with respect to the conductive layer CL, the first and third source layers SL1 and SL3, and a first insulating pattern IP1. The first protective layer PL1 may include a material having an etch selectivity with respect to oxide, nitride, and poly-silicon. In an example, the first protective layer PL1 may include at least one of SiCN, SiC, and SiCO. In an example, the first protective layer PL1 may be a single layer, or be a multi-layer including a plurality of layers.

The conductive layer CL may include an upper portion CL_U covering the upper surface PL1_T of the first protective layer PL1, a lower portion CL_L covering the lower surface PL1_B of the first protective layer PL1, and a sidewall portion CL_S covering the first sidewall PL1_S1 of the first protective layer PL1. The upper portion CL_U and the lower portion CL_L may be connected to each other by the sidewall portion CL_S. The conductive layer CL may be in contact with a channel structure CS which will be described later. The first protective layer PL1 may be spaced apart from the channel structure CS by the conductive layer CL. In an example, the conductive layer CL may include poly-silicon.

The upper portion CL_U may include a first buffer pattern BP1 in contact with the common source line 200. The first buffer pattern BP1 may include a material different from that of a portion except the first buffer pattern BP1 of the upper portion CL_U, the lower portion CL_L, and the sidewall portion CL_S. In an example, the first buffer pattern BP1 may include silicon oxide. The first buffer pattern BP1 may be formed by oxidizing a portion of the upper portion CL_U.

The third source layer SL3 may have the shape of a plate extending along a plane defined by the first direction D1 and the second direction D2. In an example, the third source layer SL3 may include poly-silicon.

The third source layer SL3 may include a second buffer pattern BP2 in contact with the common source line 200. The second buffer pattern BP2 may be connected to the first buffer pattern BP1. In an example, the second buffer pattern BP2 may include silicon oxide. The second buffer pattern BP2 may be formed by oxidizing a portion of the third source layer SL3. The first buffer pattern BP1 and the second buffer pattern BP2 may be integrally formed. In other words, the first buffer pattern BP1 and the second buffer pattern BP2 may be coupled to each other without any boundary.

The stack structure CE may include the first insulating pattern IP1, second insulating patterns IP2, gate patterns GP, and capping patterns CP.

The first insulating pattern IP1 may be provided on the third source layer SL3. In an example, the first insulating pattern IP1 may include silicon oxide.

The second insulating patterns IP2 and the gate patterns GP may be provided on the first insulating pattern IP1. The second insulating patterns IP2 and the gate patterns GP may be alternately stacked along a third direction D3. The third direction D3 may be a direction intersecting an upper surface of the substrate 100. In an example, the third direction D3 may be a direction perpendicular to the upper surface of the substrate 100.

The gate patterns GP may include a gate conductive layer. In an example, the gate conductive layer may include at least one of a doped silicon layer, a metal silicide layer, tungsten, nickel, and cobalt, and be used as a word line connected to a memory cell or a select line connected to a select transistor. The gate patterns GP may further include a gate barrier layer surrounding the gate conductive layer. In an example, the gate barrier layer may include at least one of titanium nitride and tantalum nitride. In an example, the second insulating patterns IP2 may include silicon oxide.

Each of the capping patterns CP may be disposed between the second insulating patterns IP2. Each of the capping patterns CP may be provided between the gate pattern GP and the common source line 200. The gate pattern GP and the common source line 200 may be spaced apart from each other by the capping pattern CP. The gate pattern GP and the common source line 200 may be electrically isolated from each other by the capping pattern CP. In an example, the capping patterns CP may include silicon oxide.

Unlike as shown in the drawings, an insulating spacer in replacement of the capping patterns CP may electrically isolate the gate pattern GP and the common source line 200 from each other. The insulating spacer may extend along a sidewall of the common source line 200. In an example, the insulating spacer may include silicon oxide.

The semiconductor memory device in accordance with this embodiment may further include channel structures CS penetrating the stack structure CE. The channel structure CS may penetrate the second source layer SL2 and the third source layer SL3. The channel structure CS may extend in the third direction D3. The channel structure CS may be in contact with the first source layer SL1. The lowermost portion of the channel structure CS may be provided in the first source layer SL1. The channel structure CS may be in contact with the second source layer SL2.

Each of the channel structures CS may include a filling layer FI, a channel layer CH surrounding the filling layer FI, a first tunnel layer TI1 surrounding an upper portion of the channel layer CH, a second tunnel layer TI2 surrounding a lower portion of the channel layer CH, a first storage layer DS1 surrounding the first tunnel layer TI1, a second storage layer DS2 surrounding the second tunnel layer TI2, a first blocking layer BI1 surrounding the first storage layer DS1, and a second blocking layer BI2 surrounding the second storage layer DS2.

The filling layer FI and the channel layer CH may penetrate the second source layer SL2. A sidewall of the channel layer CH may be in contact with the conductive layer CL of the second source layer SL2. The first and second tunnel layers TI1 and TI2 may be spaced apart from each other in the third direction D3 by the second source layer SL2. The first and second storage layers DS1 and DS2 may be spaced apart from each other in the third direction D3 by the second source layer SL2. The first and second blocking layers BI1 and BI2 may be spaced apart from each other in the third direction D3 by the second source layer SL2. Lower surfaces of the first tunnel layer TI1, the first storage layer DS1, and the first blocking layer BI1 may be in contact with an upper surface of the upper portion CL_U of the conductive layer CL of the second source layer SL2. Upper surfaces of the second tunnel layer TI2, the second storage layer DS2, and the second blocking layer BI2 may be in contact with a lower surface of the lower portion CL_L of the conductive layer CL of the second source layer SL2. The second tunnel layer TI2, the second storage layer DS2, and the second blocking layer BI2 may be provided in the first source layer SL1.

In an example, the filling layer FI may include silicon oxide. In an example, the channel layer CH may include doped poly-silicon or undoped poly-silicon. The first and second tunnel layers TI1 and TI2 may include oxide through which charges can tunnel. In an example, the first and second tunnel layers TI1 and TI2 may include silicon oxide. In an example, the first and second tunnel layers TI1 and TI2 may have a first thickness in which charges can tunnel. The first and second storage layers DS1 and DS2 may include a material in which charges can be trapped. In an example, the first and second storage layers DS1 and DS2 may include at least one of nitride, silicon, a phase change material, and nano dots. The first and second blocking layers BI1 and BI2 may include a material capable of blocking movement of charges. In an example, the first and second blocking layers BI1 and BI2 may include silicon oxide. In an example, the first and second blocking layers BI1 and BI2 may have a second thickness in which movement of charges can be blocked. The second thickness may be thicker than the first thickness.

The semiconductor memory device in accordance with this embodiment may further include bit lines BL connected to the channel structures CS. The bit lines BL may extend in the first direction D1. The bit lines BL may be arranged to be spaced apart from each other in the second direction D2. Each of the bit lines BL may be electrically connected to the channel structures CS through bit line contacts (not shown). The bit lines BL may include a conductive material. In an example, the bit lines BL may include tungsten, aluminum, or copper.

In the semiconductor memory device in accordance with this embodiment, the second source layer SL2 may include the conductive layer CL and the first protective layer PL1 in the conductive layer CL. Therefore, the second source layer SL2 might not include any air gap. In addition, because the conductive layer CL is protected by the first protective layer PL1, the conductive layer CL can be prevented from being damaged in a manufacturing process of the semiconductor memory device.

FIGS. 2A to 2K are sectional views illustrating a manufacturing method of the semiconductor memory device shown in FIGS. 1A and 1B.

For convenience of description, components identical to those described with reference to FIGS. 1A and 1B are designated by like reference numerals, and repeated descriptions will be omitted.

The manufacturing method described below is merely an embodiment of a method of manufacturing the semiconductor memory device shown in FIGS. 1A and 1B, and the method of manufacturing the semiconductor memory device shown in FIGS. 1A and 1B is not limited to the manufacturing method described below.

Referring to FIG. 2A, a source structure SL may be formed on a substrate 100. The source structure SL may include a first source layer SL1, a source sacrificial structure SSC, and a third source layer SL3.

In an example, as shown in the drawing, the source sacrificial structure SSC may include first to third source sacrificial layers SSC1, SSC2, and SSC3. In another example, unlike as shown in the drawing, the source sacrificial structure SSC may be configured in a single layer. Hereinafter, although a case where the source sacrificial structure SSC includes the first to third source sacrificial layers SSC1, SSC2, and SSC3 is described as an example, the structure of the source sacrificial structure SSC is not limited thereto.

The first source layer SL1, the first to third source sacrificial layers SSC1, SSC2, and SSC3, and the third source layer SL3 may be sequentially formed on the substrate 100, thereby forming the source structure SL.

Subsequently, a first insulating layer IL1 may be formed on the source structure SL, and second insulating layers IL2 and gate sacrificial layers GSC may be alternately stacked on the first insulating layer IL1.

In an example, the first source sacrificial layer SSC1 may include oxide or a high dielectric constant (high-k) material. In an example, the high dielectric constant (high-k) material may include Al2O3. In an example, the second source sacrificial layer SSC2 may include poly silicon. In an example, the third source sacrificial layer SSC3 may include oxide or a high dielectric constant (high-k) material.

In an example, the first insulating layer IL1 and the second insulating layer IL2 may include silicon oxide. The gate sacrificial layer GSC may include a material having a high etch selectivity with respect to the second insulating layer IL2. In an example, the gate sacrificial layer GSC may include silicon nitride.

Figure 2B:
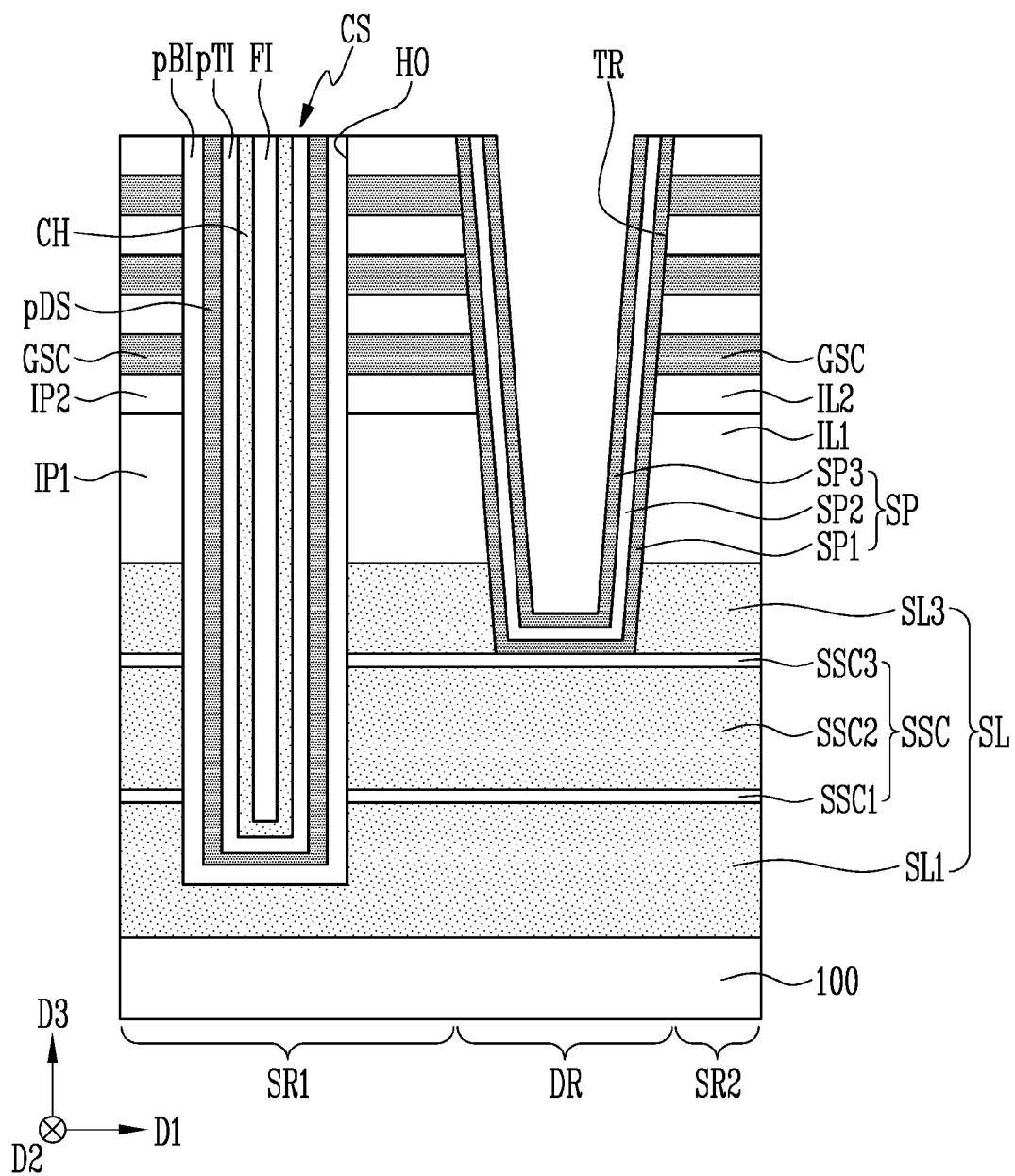

Referring to FIG. 2B, channel structures CS may be formed, which penetrate the first to third source sacrificial layers SSC1, SSC2, and SSC3, the third source layer SL3, the first insulating layer IL1, the second insulating layers IL2, and the gate sacrificial layers GSC. The channel structure CS may include a preliminary blocking layer pBI, a preliminary storage layer pDS, a preliminary tunnel layer pTI, a channel layer CH, and a filling layer FI.

The process of forming the channel structures CS may include holes HO penetrating the first to third source sacrificial layers SSC1, SSC2, and SSC3, the third source layer SL3, the first insulating layer IL1, the second insulating layers IL2, and the gate sacrificial layers GSC, and a process of sequentially filling each of the holes HO with the preliminary blocking layer pBI, the preliminary storage layer pDS, the preliminary tunnel layer pTI, the channel layer CH, and the filling layer FI.

In an example, the preliminary blocking layer pBI may include silicon oxide. In an example, the preliminary storage layer pDS may include at least one of nitride, silicon, a phase change material, and nano dots. In an example, the preliminary tunnel layer pTI may include silicon oxide.

A trench TR may be formed, which penetrates the first insulating layer IL1, the second insulating layers IL2, and the gate sacrificial layers GSC. The trench TR may penetrate at least a portion of the source structure SL. In an example, the trench TR may penetrate the third source layer SL3 of the source structure SL.

The trench TR may extend in the second direction D2. An upper surface of the third source sacrificial layer SSC3 may be exposed by the trench TR, and sidewalls of the first and second insulating layers IL1 and IL2 and the gate sacrificial layers GSC may be exposed by the trench TR. The trench TR may vertically overlap with an isolation region DR of the substrate 100.

A spacer layer SP may be formed, which conformally covers the upper surface of the third source sacrificial layer SSC3, which is exposed by the trench TR, and conformally covers the sidewalls of the first and second insulating layers IL1 and IL2 and the gate sacrificial layers GSC.

In an example, as shown in the drawing, the spacer layer SP may include first to third spacer layers SP1, SP2, and SP3. In another example, unlike as shown in the drawing, the spacer layer SP may be configured in a single layer. Hereinafter, a case where the spacer layer SP includes the first to third spacer layers SP1, SP2, and SP3 is described as an example, the structure of the spacer layer SP is not limited thereto.

The first spacer layer SP1 may be formed on surfaces defining trenches TR. In an example, the first spacer layer SP1 may include silicon nitride. The second spacer layer SP2 may be formed on the first spacer layer SP1, and the third spacer layer SP3 may be formed on the second spacer layer SP2. In an example, the second spacer layer SP2 may include silicon oxide, and the third spacer layer SP3 may include silicon nitride.

When the holes HO and the trench TR are formed, the first insulating layer IL1 may be formed as a first insulating pattern IP1, and the second insulating layers IL2 may be formed as second insulating patterns IP2.

Figure 2C:
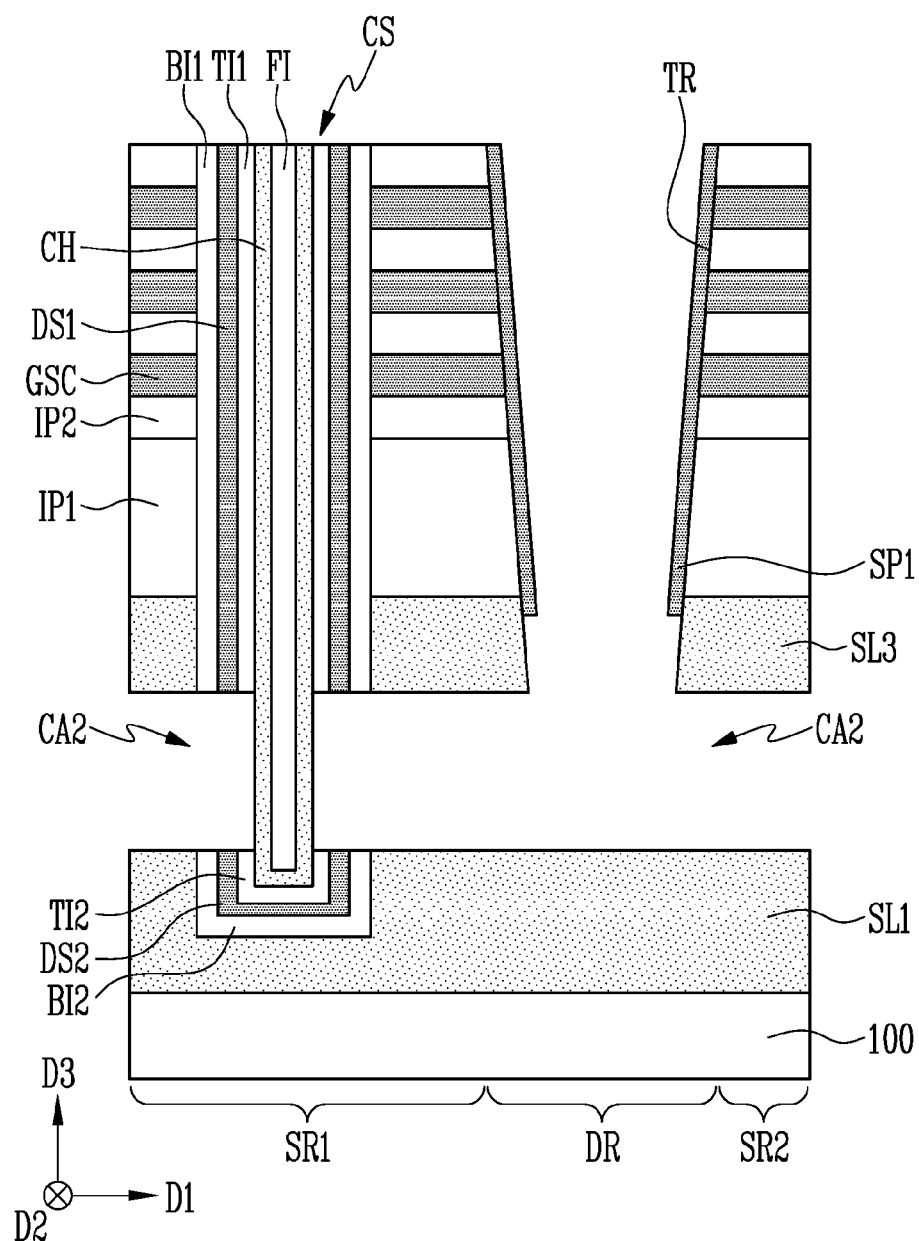

Referring to FIG. 2C, a portion of each of the first to third spacer layers SP1, SP2, and SP3 and the second source sacrificial layer SSC2 may be removed. The process of removing a portion of each of the first to third spacer layers SP1, SP2, and SP3 and the second source sacrificial layer SSC2 may include a process of removing a portion of each of the first to third spacer layers SP1, SP2, and SP3, a portion of the third source sacrificial layer SSC3, and a portion of the second source sacrificial layer SSC2 through an etch-back process and a process of removing the whole of the second source sacrificial layer SSC2 through a dip-out process.

After the whole of the second source sacrificial layer SSC2 is removed, the preliminary blocking layer pBI, the preliminary storage layer pDS, and the preliminary tunnel layer pTI of the channel structure CS may be patterned. Through the patterning, the preliminary blocking layer pBI may be formed with first and second blocking layers BI1 and BI2, the preliminary storage layer pDS may be formed with first and second storage layers DS1 and DS2, and the preliminary tunnel layer pTI may be formed with first and second tunnel layers TI1 and TI2. At the same time when the preliminary blocking layer pBI, the preliminary storage layer pDS, and the preliminary tunnel layer pTI of the channel structure CS are patterned, the first source sacrificial layer SSC1 and the third source sacrificial layer SSC3 may be removed, and the second and third spacer layers SP2 and SP3 may be removed. When the first to third source sacrificial layers SSC1, SSC2, and SSC3 are removed, and the preliminary blocking layer pBI, the preliminary storage layer pDS, and the preliminary tunnel layer pTI are patterned, a second cavity CA2 may be formed between the first source layer SL1 and the third source layer SL3. The second cavity CA2 may include an empty space formed by removing the first to third source sacrificial layers SSC1, SSC2, and SSC3 and an empty space formed by patterning the preliminary blocking layer pBI, the preliminary storage layer pDS, and the preliminary tunnel layer pTI.

Figure 2D:
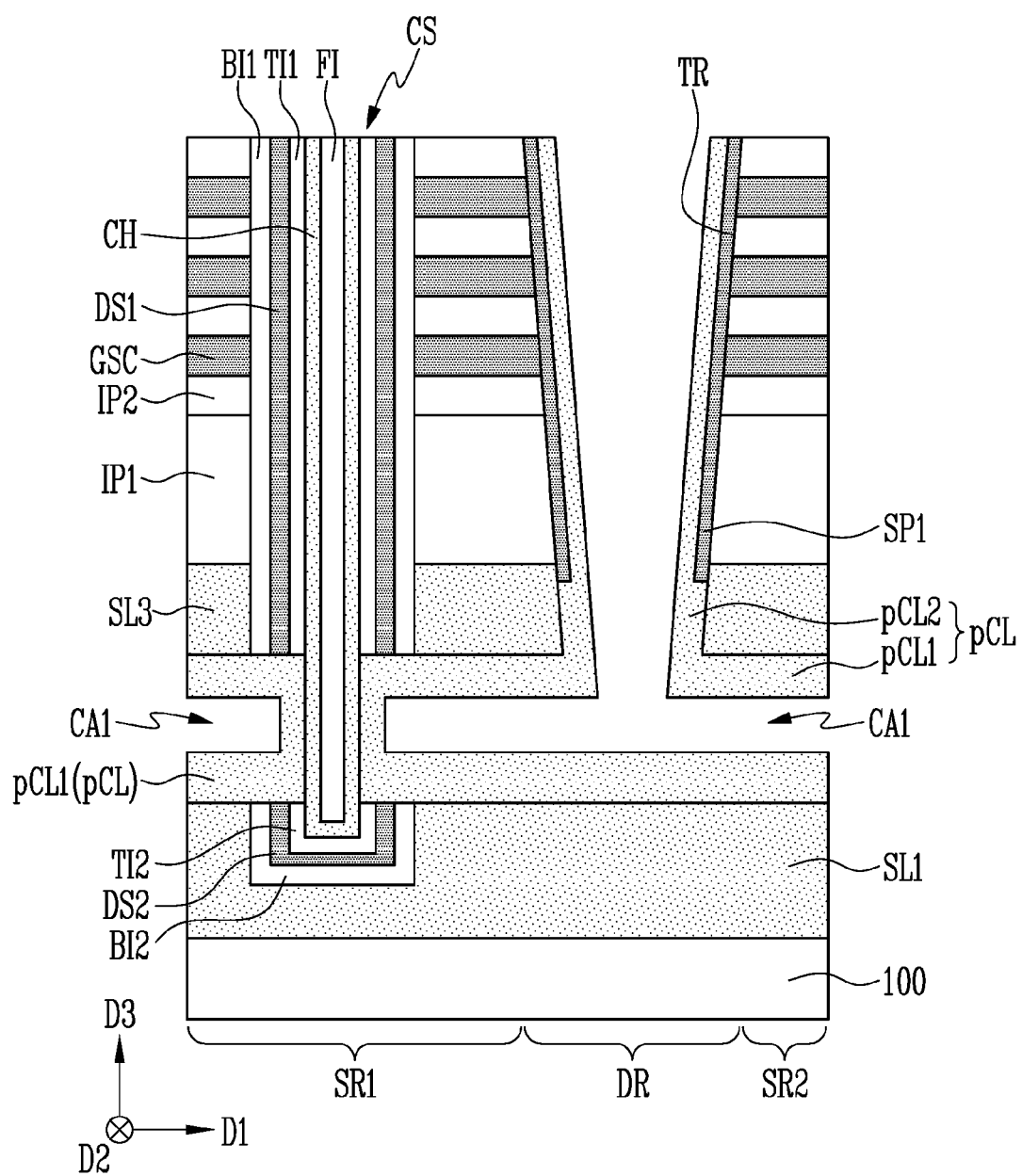

Referring to FIG. 2D, a preliminary conductive layer pCL may be formed, which fills a portion of the second cavity CA2 and a portion of the trench TR. The preliminary conductive layer pCL may include a first preliminary conductive part pCL1 in the second cavity CA2 and a second preliminary conductive part pCL2 in the trench TR. The first preliminary conductive part pCL1 may fill a portion of the second cavity CA2. The first preliminary conductive part pCL1 may cover surfaces of the first source layer SL1, the third source layer SL3, and the channel structure CS, which define the second cavity CA2. The second preliminary conductive part pCL2 may fill a portion of the trench TR. The second preliminary conductive part pCL2 may cover a sidewall of the first spacer layer SP1. The preliminary conductive layer pCL may be formed along surfaces exposed by the trench TR and the second cavity CA2.

A first cavity CA1 may be formed by the first preliminary conductive part pCL1. A portion of the second cavity CA2, which is not filled by the first preliminary conductive part pCL1, may be defined as the first cavity CA1. In other words, the first cavity CA1 may be provided in the first preliminary conductive part pCL1.

Figure 2E:
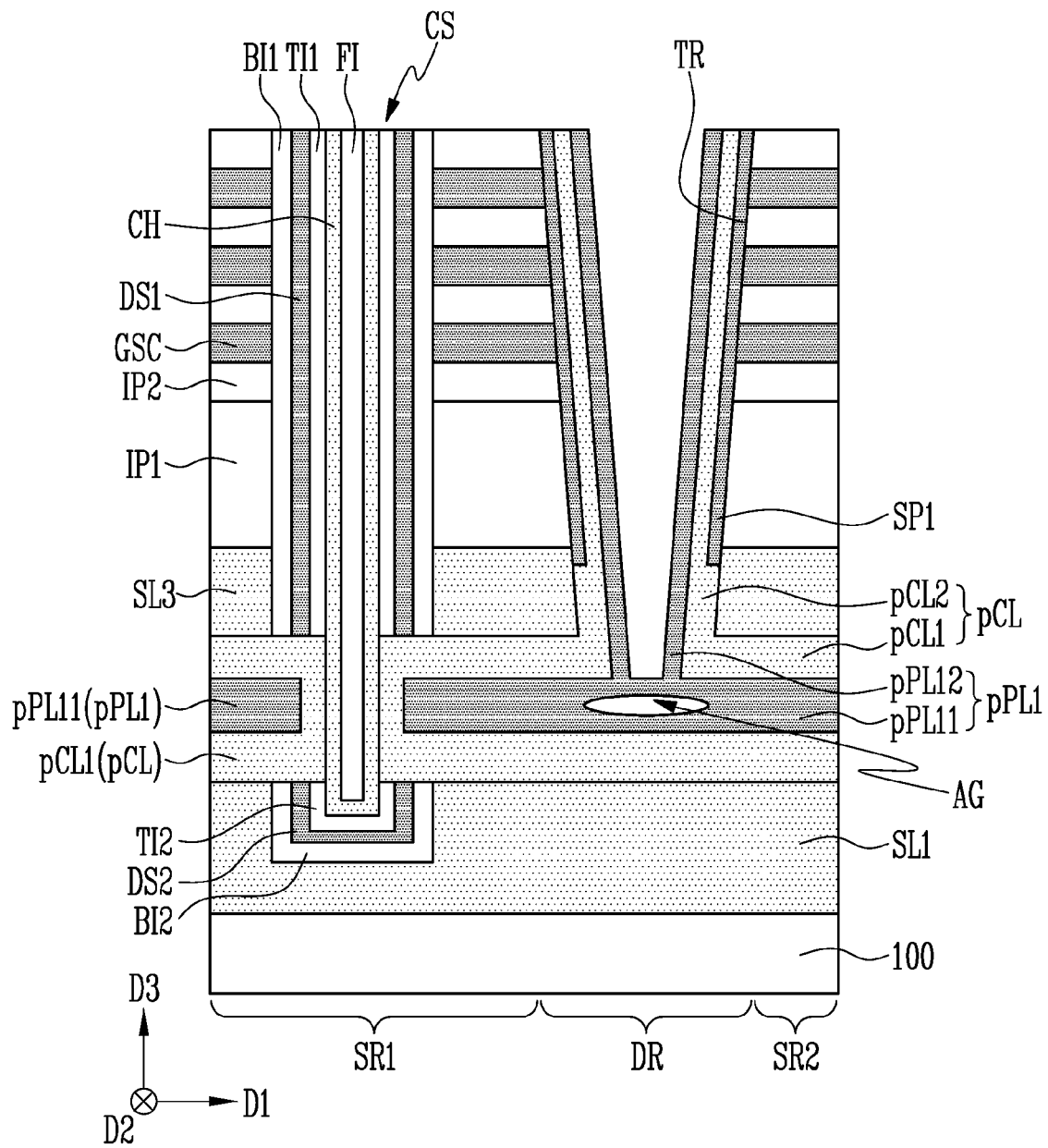

Referring to FIG. 2E, a first preliminary protective layer pPL1 may be formed in the first cavity CA1 and the trench TR. The first preliminary protective layer pPL1 may fill a portion of the first cavity CA1 and a portion of the trench TR. The first preliminary protective layer pPL1 may include a first preliminary protective part pPL11 in the first cavity CA1 and a second preliminary protective part pPL12 in the trench TR. The first preliminary protective part pPL11 may fill a portion of the first cavity CA1. The first preliminary protective part pPL11 may cover surfaces of the first preliminary conductive part pCL1, which define the first cavity CA1. The second preliminary protective part pPL12 may fill a portion of the trench TR. The second preliminary protective part pPL12 may cover a sidewall of the second preliminary conductive part pCL2. The first preliminary protective layer pPL1 may include a material having an etch selectivity with respect to the preliminary conductive layer pCL, the first and third source layers SL1 and SL3, and the first insulating pattern IP1. In an example, the first preliminary protective layer pPL1 may be formed through a deposition process.

An air gap AG may be formed by the first preliminary protective part pPL11. A portion of the first cavity CA1, which is not filled by the first preliminary protective part pPL11, may be defined as the air gap AG. The air gap AG may be surrounded by the first preliminary protective part pPL11. The air gap AG may be sealed by the first preliminary protective part pPL11.

Although a case where the air gap AG is formed in the first preliminary protective layer pPL1 is described in the above, the first preliminary protective layer pPL1 may be formed in a multi-layer. When the first preliminary protective layer pPL1 is formed in the multi-layer, the air gap AG might not be formed in the first preliminary protective layer pPL1, or the size of the air gap AG may be decreased.

Figure 2F:
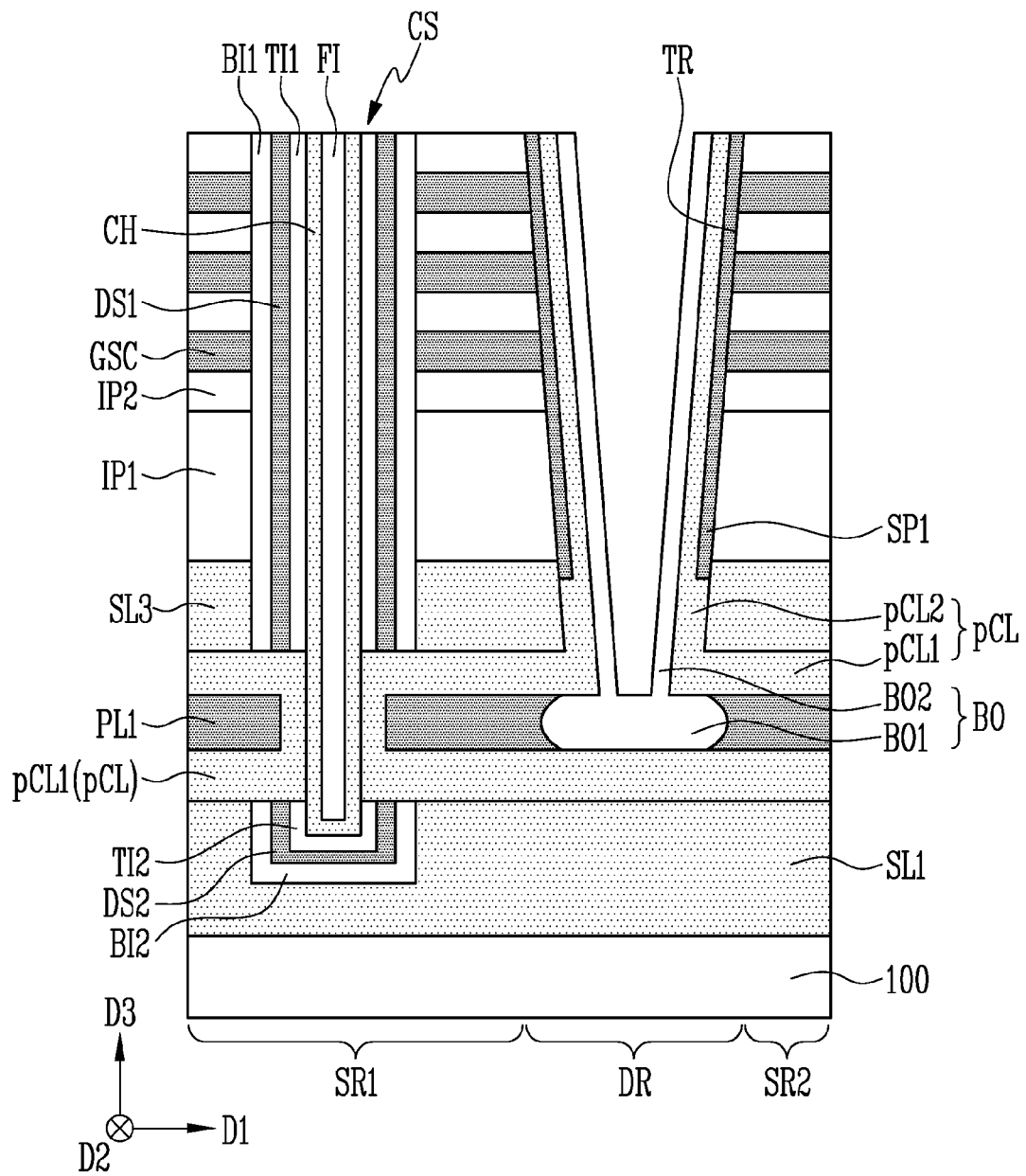
Figure 2G:
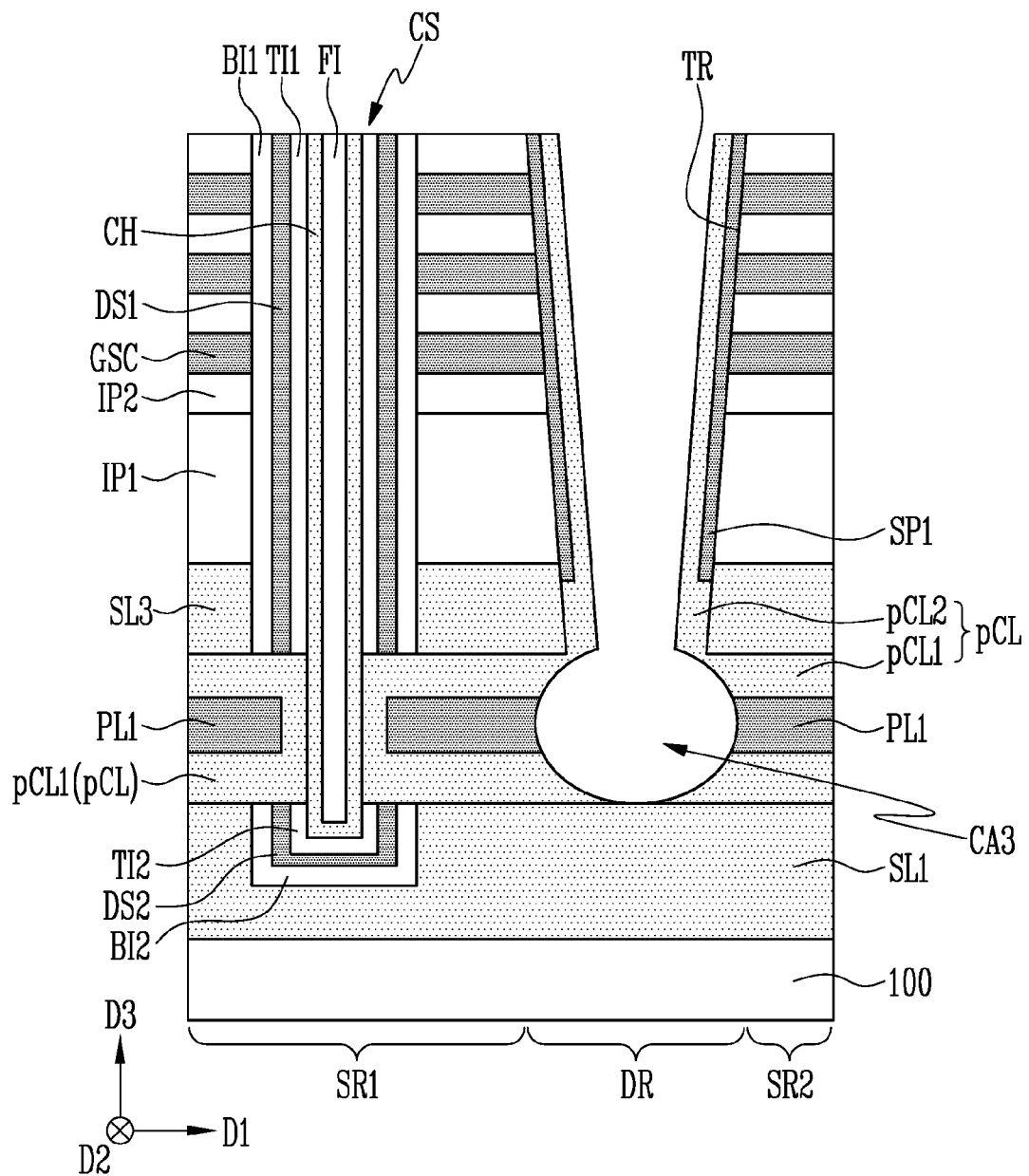

Referring to FIGS. 2F and 2G, the second preliminary protective part pPL12 may be removed. A portion of the first preliminary protective part pPL11 may be removed together with the whole of the second preliminary protective part pPL12. The process of removing the whole of the second preliminary protective part pPL12 and a portion of the first preliminary protective part pPL11 may include a process of forming a barrier oxide layer BO by oxidizing the whole of the second preliminary protective part pPL12 and a portion of the first preliminary protective part pPL11 (see FIG. 2F), and a process of removing the barrier oxide layer BO (see FIG. 2G).

In the process of forming a barrier oxide layer BO by oxidizing the whole of the second preliminary protective part pPL12 and a portion of the first preliminary protective part pPL11, the whole of the second preliminary protective part pPL12 may be oxidized, and a portion of the first preliminary protective part pPL11 may be oxidized. The first preliminary protective layer pPL1 may be oxidized by supplying oxygen gas to the first preliminary protective layer pPL1. In an example, when the first preliminary protective layer pPL1 includes at least one of SiCN, SiC, and SiCO, carbon dioxide gas may be generated through coupling of carbon included in the first preliminary protective layer pPL1 to oxygen gas, when the oxygen gas is supplied to a surface of the first preliminary protective layer pPL1. Therefore, the carbon may be removed from the first preliminary protective layer pPL1, so that the barrier oxide layer BO is formed. In an example, the barrier oxide BO may include silicon oxide.

The barrier oxide layer BO may include a first oxidation part BO1 and a second oxidation part BO2. The first oxidation part BO1 may be formed by oxidizing a portion of the first preliminary protective part pPL11. The second oxidation part BO2 may be formed by oxidizing the whole of the second preliminary protective part pPL12. The first oxidation part BO1 may vertically overlap with the isolation region DR of the substrate 100. When the first oxidation part BO1 is formed, the air gap AG may be filled by the first oxidation part BO1. A volume of the first oxidation part BO1 may be greater than that of the air gap AG. In the first preliminary protective part pPL11, an unoxidized portion may be defined as a first protective layer PL1.

In the process of removing the barrier oxide layer BO, the first oxidation part BO1 of the barrier oxide layer BO may be removed, and the second oxidation part BO2 of the barrier oxide layer BO may be removed. When the second oxidation part BO2 of the barrier oxide layer BO is removed, the sidewall of the second preliminary conductive part pCL2 in the trench TR may be again exposed. When the first oxidation part BO1 of the barrier oxide layer BO is removed, portions of the first protective layer PL1 and the preliminary conductive layer pCL, which are adjacent to the first oxidation part BO1, may be removed together with the first oxidation part BO1, and a third cavity CA3 may be formed. A volume of the third cavity CA3 may be greater than that of the first oxidation part of the barrier oxide layer BO.

The whole of the second preliminary protective part pPL12 and a portion of the first preliminary protective part pPL11 may be removed without being oxidized. The first protective layer PL1 may be formed by etching the whole of the second preliminary protective part pPL12 and the portion of the first preliminary protective part pPL11. In an example, the whole of the second preliminary protective part pPL12 and the portion of the first preliminary protective part pPL11 may be etched using a dry etching process.

Figure 2H:
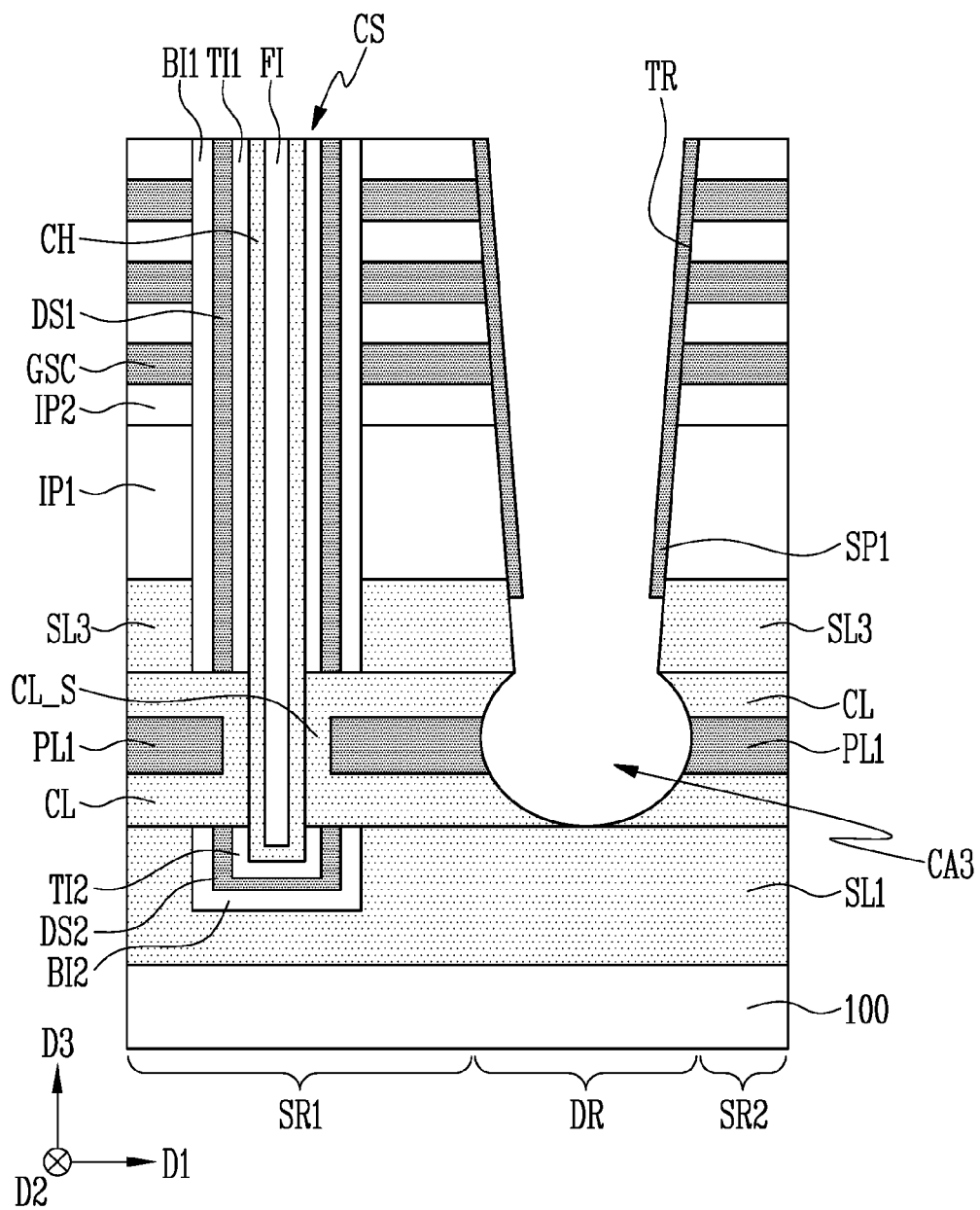

Referring to FIG. 2H, the second preliminary conductive part pCL2 of the preliminary conductive layer pCL may be removed. When the second preliminary conductive part pCL2 is removed, the sidewall of the first spacer layer SP1 may be again exposed. When the second preliminary conductive part pCL2 is removed, remaining first preliminary conductive part pCL1 may be defined as the conductive layer CL. When the second preliminary conductive part pCL2 is removed, the third cavity CA3 may be expanded.

The second preliminary conductive part pCL2 may be removed through an etching process. In an example, the second preliminary conductive part pCL2 may be removed through a wet etching process. When the first preliminary conductive part pCL1 includes an air gap, an etchant for etching the second preliminary conductive part pCL2 may be introduced into the air gap in the etching process of the second preliminary conductive part pCL2, and the first preliminary conductive part pCL1 may be etched by the etchant.

In accordance with an embodiment of the present disclosure, because the first protective layer PL1 is formed in the first preliminary conductive part pCL1, the first preliminary conductive part pCL1 may be protected by the first protective layer PL1. Thus, an etchant is introduced into the first preliminary conductive part pCL1, so that the first preliminary conductive part pCL1 can be prevented from being etched. In addition, the second preliminary conductive part pCL2 may be selectively etched.

The conductive layer CL on a first stack region SR1 of the substrate 100 and the conductive layer CL on a second stack region SR2 of the substrate 100 may be spaced apart from each other in the first direction D1 by the third cavity CA3. The first protective layer PL1 on the first stack region SR1 of the substrate 100 and the first protective layer PL1 on the second stack region SR2 of the substrate 100 may be spaced apart from each other in the first direction D1 by the third cavity CA3.

Figure 2I:
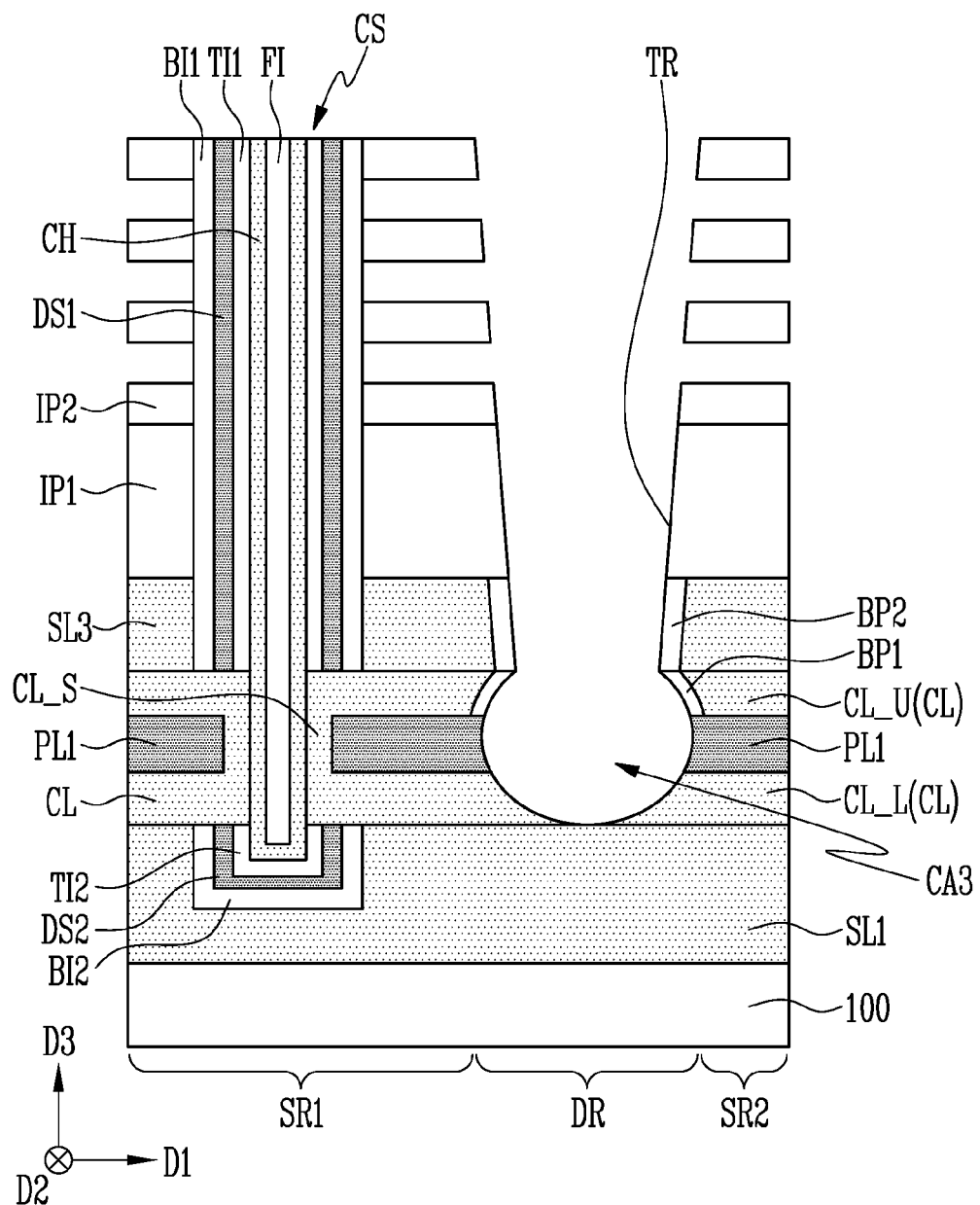

Referring to FIG. 2I, a portion of an upper portion CL_U of the conductive layer CL, which is exposed by the third cavity CA3, may be oxidized. When the portion of the upper portion CL_U of the conductive layer CL is oxidized, a first buffer pattern BP1 is formed. At the same time when the first buffer pattern BP1 is formed, a sidewall of the third source layer SL3, which is exposed by the trench TR, may be oxidized, so that a second buffer pattern BP2 is formed. The first and second buffer patterns BP1 and BP2 may be integrally formed.

According to a material included in a lower portion CL_L of the conductive layer CL and the first protective layer PL1, an oxidation process condition, and the like, the upper portion CL_U of the conductive layer CL and the sidewall of the third source layer SL3 may be oxidized without oxidation of the lower portion CL_L of conductive layer CL and the first protective layer PL1. Alternatively, the lower portion CL_L of the conductive layer CL and a sidewall of the first protective layer PL1 may be oxidized together with the upper portion CL_U of the conductive layer CL and the sidewall of the third source layer SL3, and a buffer pattern may be additionally formed on the lower portion CL_L of the conductive layer CL or the sidewall of the first protective layer PL1.

After the first and second buffer patterns BP1 and BP2 are formed, the first spacer layer SP1 may be removed. Subsequently, the gate sacrificial layers GSC exposed when the first spacer layer SP1 is removed may be removed.

When the first protective layer PL1 is disposed in the conductive layer CL, the conductive layer CL can be protected from an etchant for removing the first spacer layer SP1 and the gate sacrificial layers GSC, in the process of removing the first spacer layer SP1 and the gate sacrificial layers GSC. In particular, a sidewall portion CL_S of the conductive layer CL can be protected from the etchant.

Figure 2J:
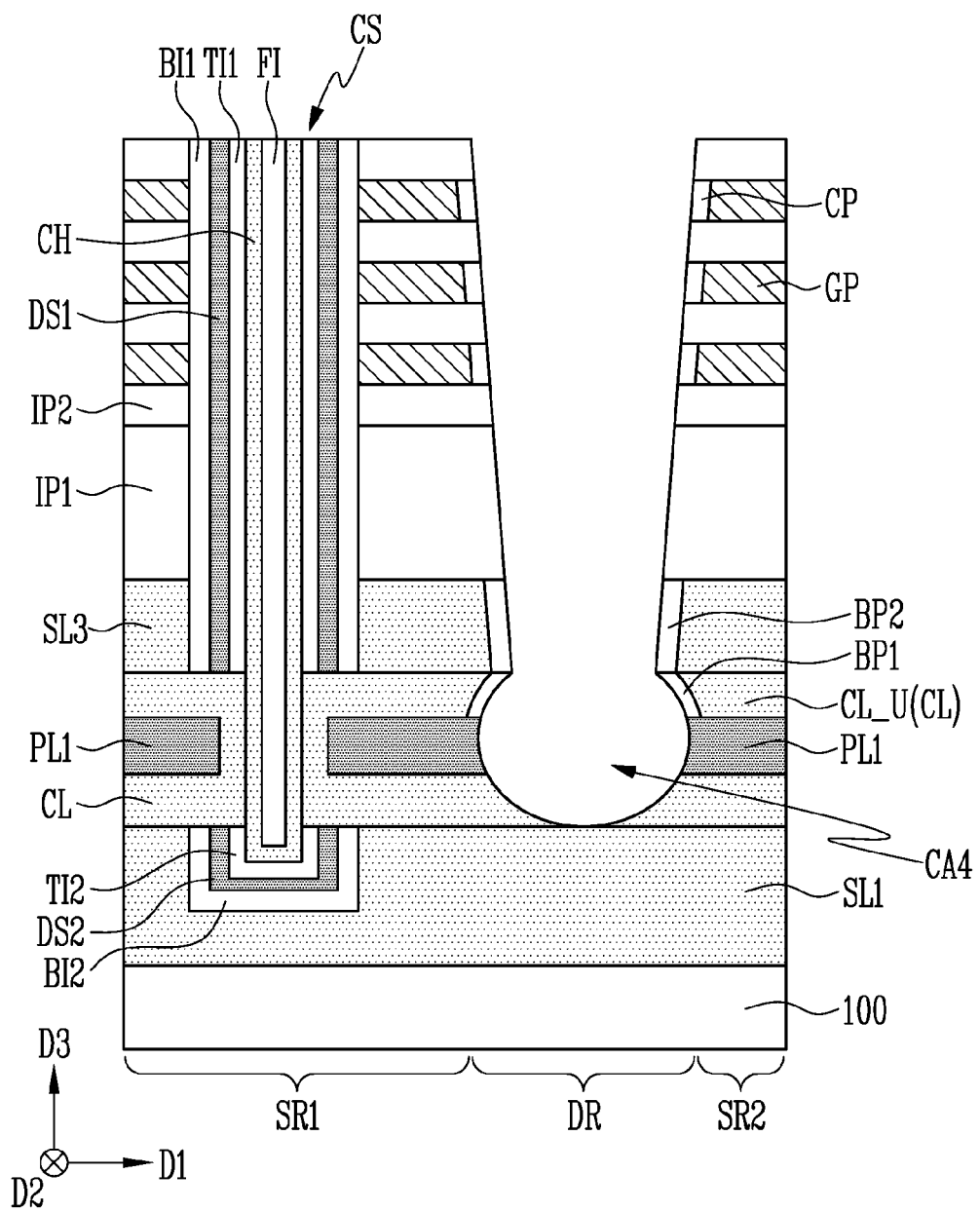

Referring to FIG. 2J, gate patterns GP may be formed between the second insulating patterns IP2. Subsequently, capping patterns CP covering the gate patterns GP may be formed. The capping patterns CP may function to electrically isolate a common source line 200 formed in a subsequent process and the gate patterns GP from each other. The capping patterns CP may be formed by oxidizing portions of the gate patterns GP. Alternatively, the capping patterns CP may be formed by removing portions of the gate patterns GP and forming an insulating material in empty spaces in which the portions of the gate patterns GP are removed.

Figure 2K:
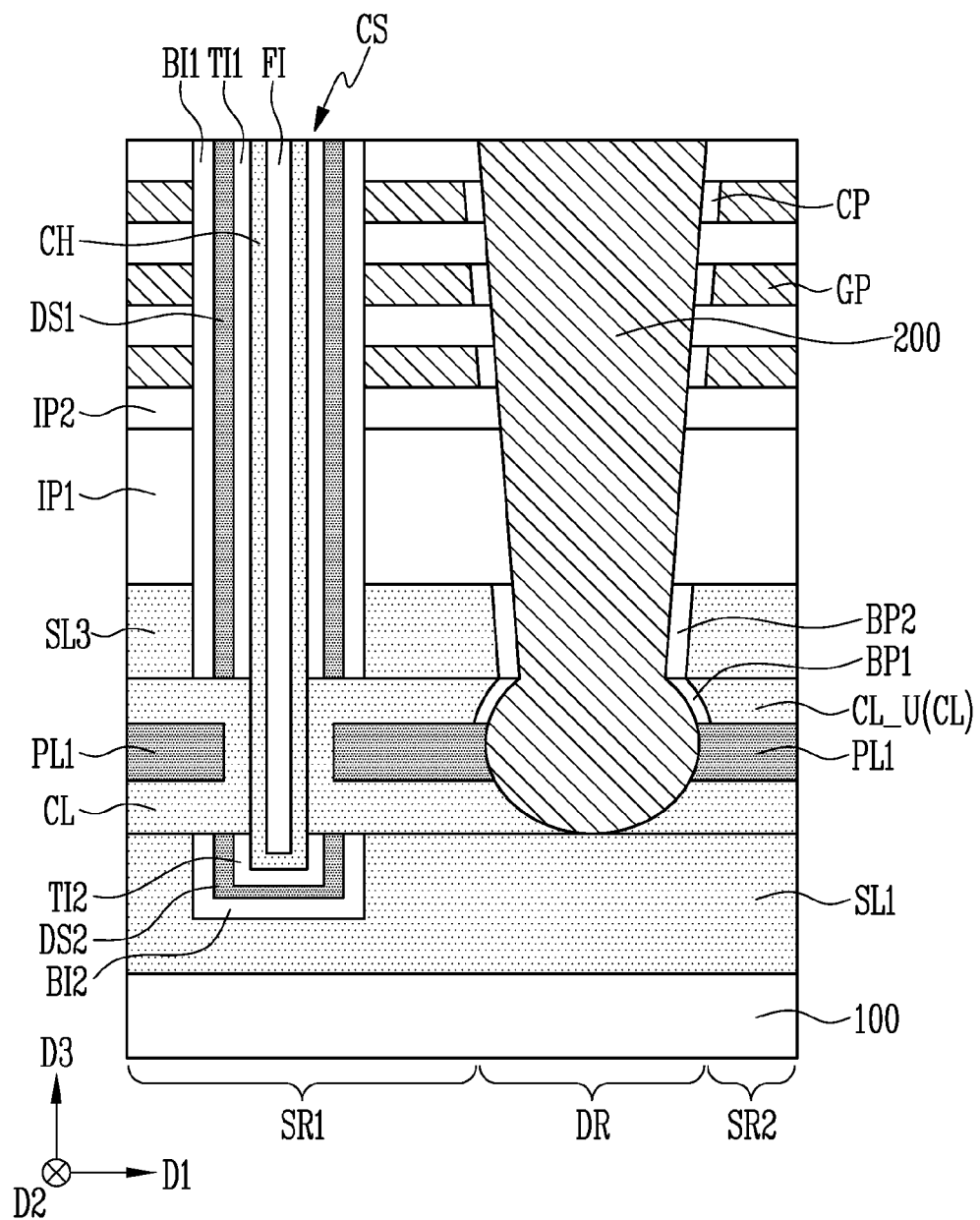

Referring to FIG. 2K, the common source line 200 may be formed in the trench TR and the third cavity CA3. The common source line 200 may completely fill the trench TR and the third cavity CA3. Subsequently, bit line contacts connected to the channel structures CS may be formed, and bit lines connected to the bit line contacts may be formed.

Figure 3:
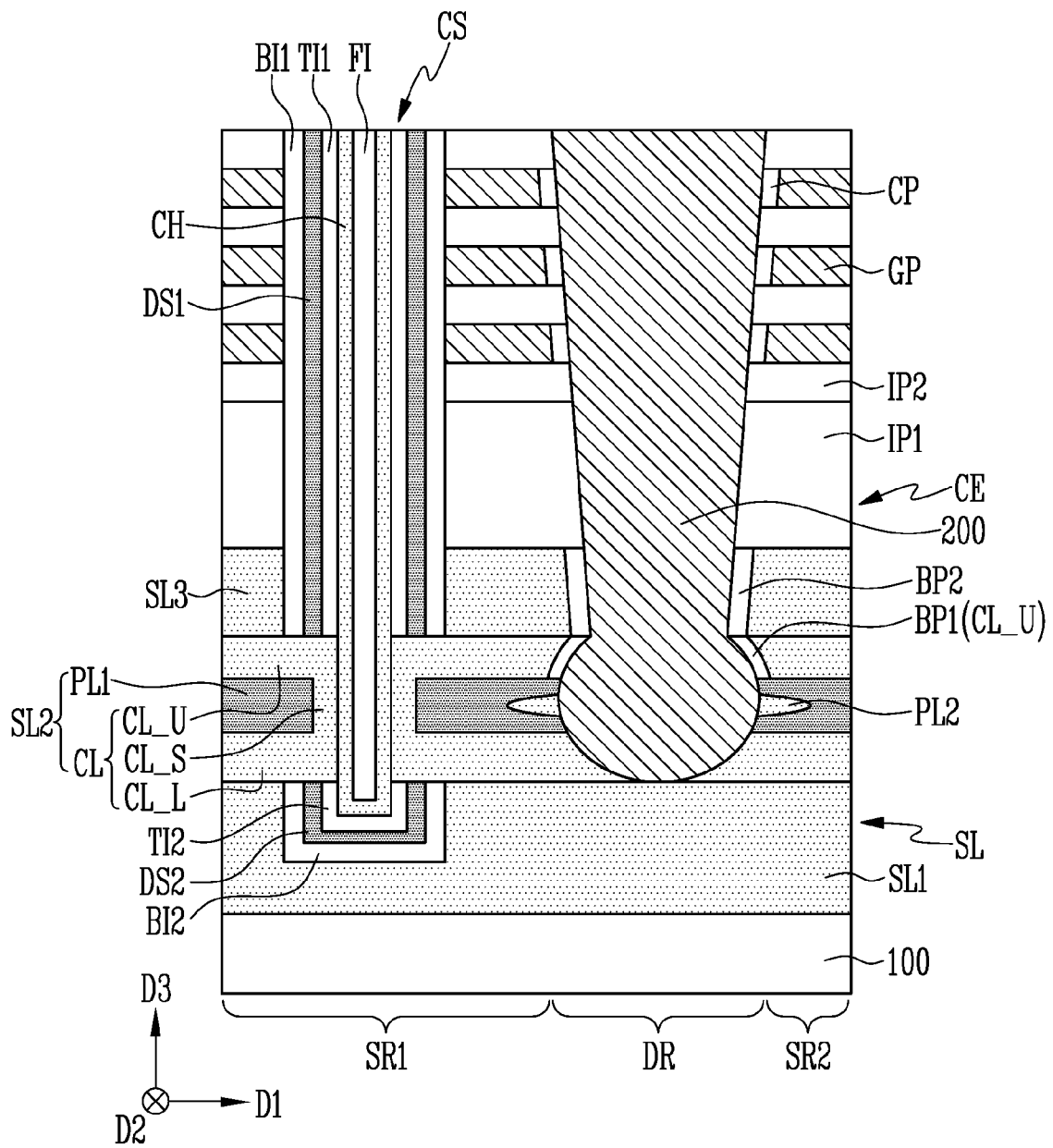
FIG. 3 is a sectional view of a semiconductor memory device in accordance with an embodiment of the present disclosure.

FIG. 3 is a sectional view of a semiconductor memory device in accordance with an embodiment of the present disclosure.

The semiconductor memory device of FIG. 3 may be similar to the semiconductor memory device shown in FIGS. 1A and 1B, except for portions described below.

Referring to FIG. 3, a second source layer SL2 of the semiconductor memory device may further include second protective layers PL2. The second protective layer PL2 may be provided in a first protective layer PL1. The second protective layer PL2 may be spaced apart from a conductive layer CL by the first protective layer PL1. The second protective layers PL2 may be located at both sides of a common source line 200. Each of the second protective layers PL2 may be in contact with the common source line 200. In an example, the second protective layer PL2 may include oxide. The second protective layer PL2 may include a material different from that of the first protective layer PL1.

For the semiconductor memory device in accordance with this embodiment, the first protective layer PL1 is provided in the conductive layer CL, and the second protective layer PL2 is provided in the first protective layer PL1, so that the inside of the conductive layer CL can be filled by the first protective layer PL1 and the second protective layer PL2. Thus, any air gap is not formed in the conductive layer CL, and the conductive layer CL can be prevented from being damaged in a manufacturing process of the semiconductor memory device.

FIGS. 4A to 4E are sectional views illustrating a manufacturing method of the semiconductor memory device shown in FIG. 3.

The manufacturing method of the semiconductor memory device in accordance with this embodiment may be similar to the manufacturing method of the semiconductor memory device shown in FIGS. 2A to 2K, except for portions described below.

Figure 4A:
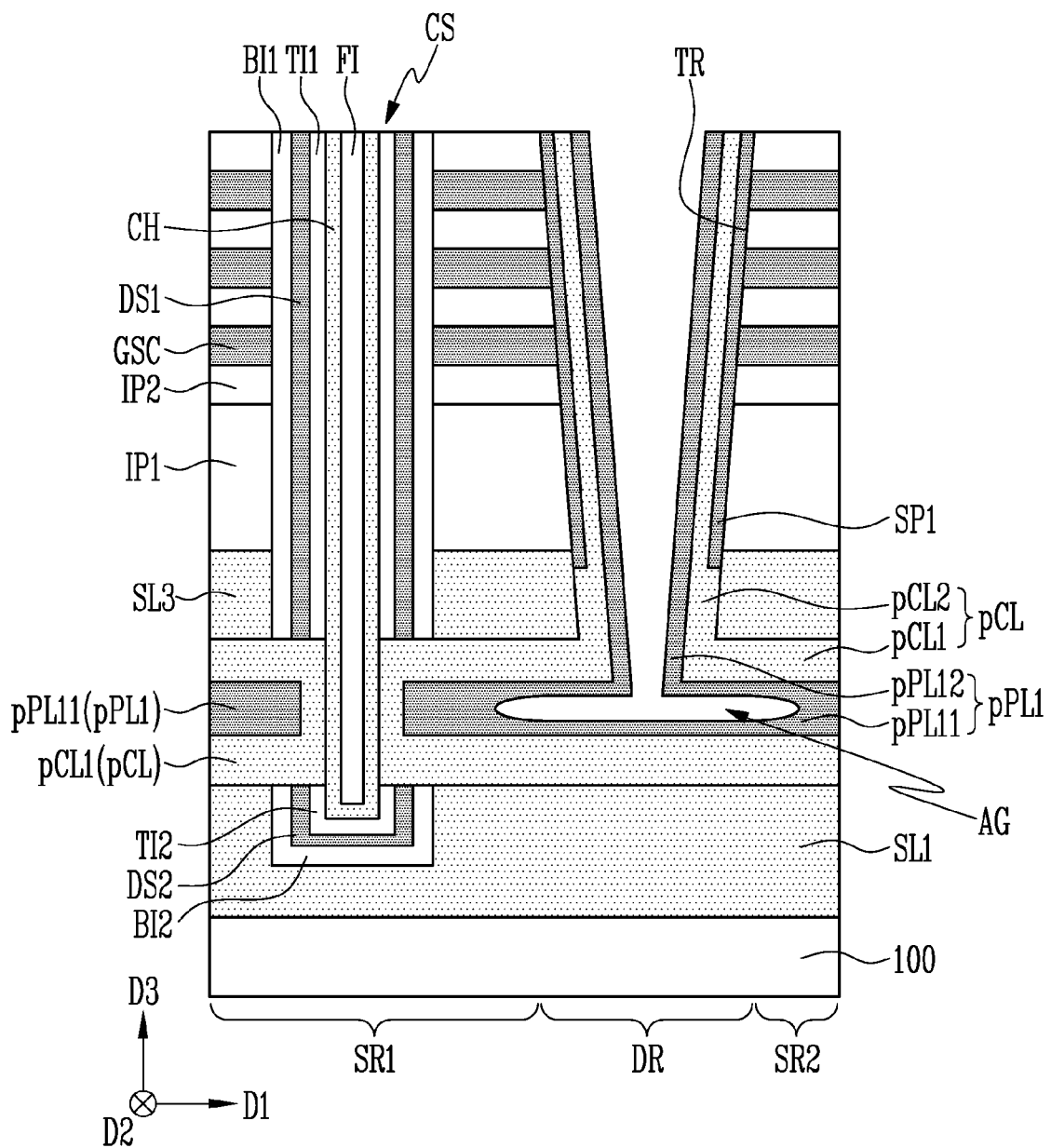
FIGS. 4A to 4E are sectional views illustrating a manufacturing method of the semiconductor memory device shown in FIG. 3.

Referring to FIG. 4A, similarly to the manufacturing method described with reference to FIGS. 2A to 2D, a substrate 100, a first source layer SL1, a third source layer SL3, first and second insulating patterns IP1 and IP2, gate sacrificial patterns GSC, a channel structure CS, and a preliminary conductive layer pCL may be formed.

Subsequently, a first preliminary protective layer pPL1 may be formed. The first preliminary protective layer pPL1 may include a first preliminary protective part pPL11 and a second preliminary protective part pPL12. When the first preliminary protective layer pPL1 is formed, an air gap AG may be formed in the first preliminary protective part pPL11.

A width of the air gap AG in the first direction D1 in the manufacturing method in accordance with this embodiment may be wider than that of the air gap AG in the first direction D1 in the manufacturing method shown in FIG. 2E. In other words, in the manufacturing method in accordance with this embodiment, the air gap AG may be formed to have a relatively wide width. The air gap AG may be connected to the outside through a trench TR.

Figure 4B:
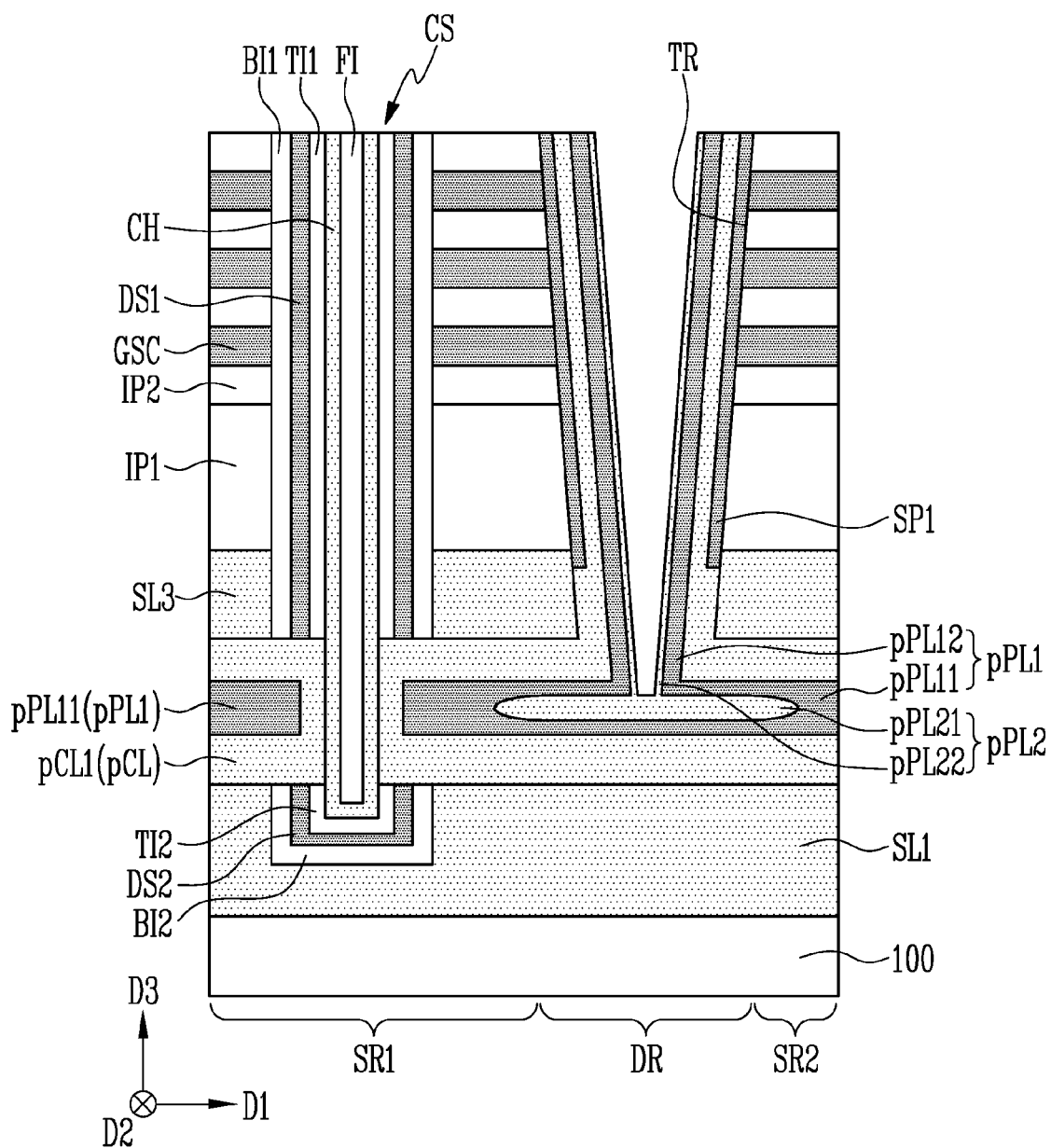

Referring to FIG. 4B, a second preliminary protective layer pPL2 may be formed in the air gap AG and the trench TR. The second preliminary protective layer pPL2 may fill the whole of the air gap AG, and fill a portion of the trench TR. The second preliminary protective layer pPL2 may be formed on a surface of the first preliminary protective layer pPL1. The second preliminary protective layer pPL2 may include a third preliminary protective part pPL21 in the air gap AG and a fourth preliminary protective part pPL22 in the trench TR. The third preliminary protective part pPL21 may cover a surface of the first preliminary protective part pPL11, and the fourth preliminary protective part pPL22 may cover a sidewall of the second preliminary protective part pPL12. The second preliminary protective layer pPL2 may include a material which can be oxidized by reacting with oxygen. In an example, the second preliminary protective layer pPL2 may include silicon, oxide, or nitride.

Figure 4C:
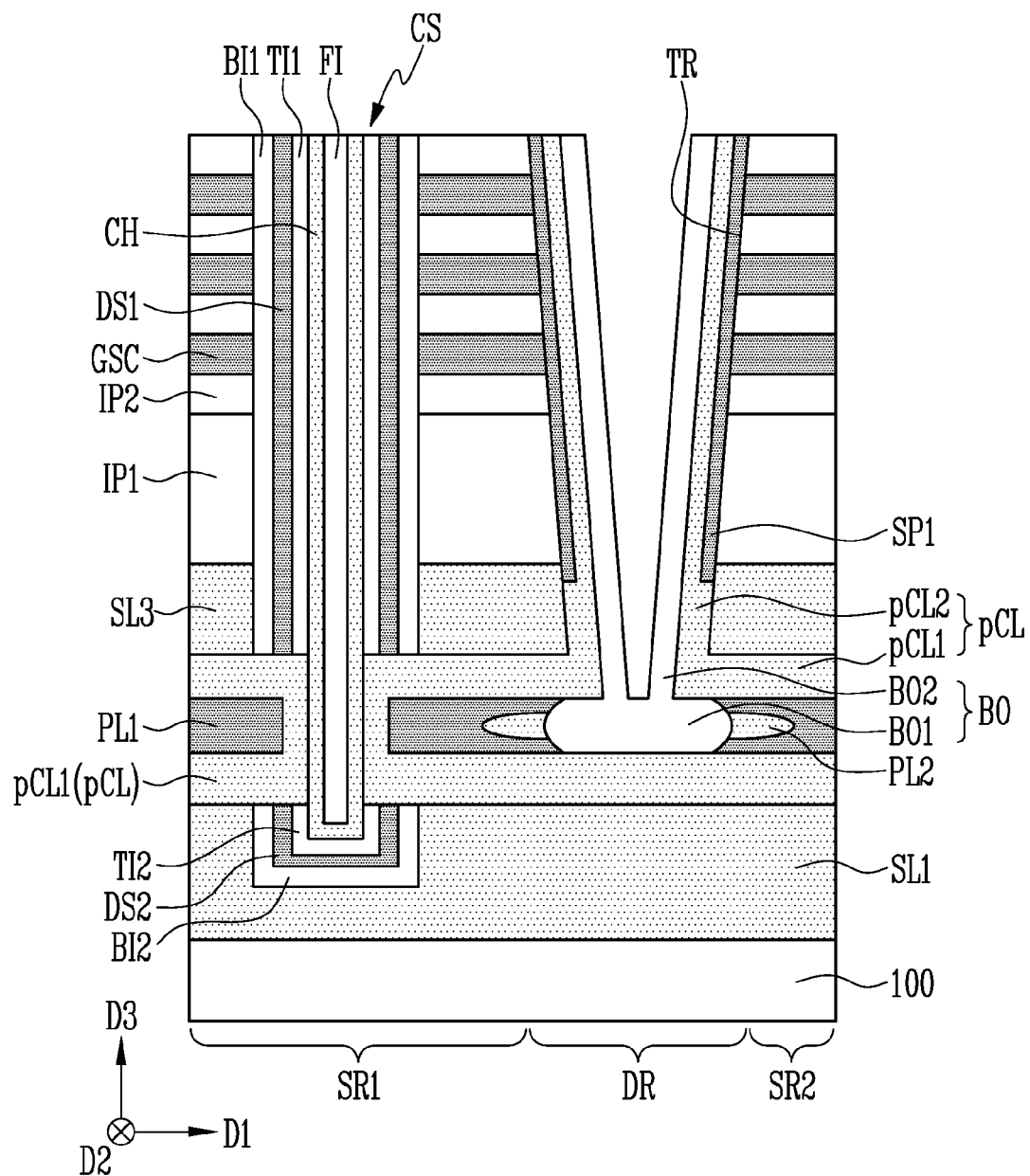

Referring to FIG. 4C, the second preliminary protective part pPL12 and the fourth preliminary protective part pPL22 may be removed. The second preliminary protective part pPL12 and the fourth preliminary protective part pPL22 may be removed through an oxidation process or an etching process.

In the oxidation process, the whole of the second preliminary protective part pPL12 and the whole of the fourth preliminary protective part pPL22 may be oxidized, and a portion of the first preliminary protective part pPL11 and a portion of the third preliminary protective part pPL21 may be oxidized. The first preliminary protective layer pPL1 and the second preliminary protective layer pPL2 may be oxidized by supplying oxygen gas onto the second preliminary protective layer pPL2.

A barrier oxide layer BO may include a first oxidation part BO1 and a second oxidation part BO2. The first oxidation part BO1 may be formed by oxidizing a portion of the first preliminary protective part pPL11 and a portion of the third preliminary protective part pPL21. The second oxidation part BO2 may be formed by oxidizing the whole of the second preliminary protective part pPL12 and the whole of the fourth preliminary protective part pPL22.

In the first preliminary protective part pPL11, an unoxidized portion may be defined as a first protective layer PL1. In the third preliminary protective part pPL21, an unoxidized portion may be defined as a second protective layer PL2. The second protective layer PL2 may be located in the first protective layer PL1.

Figure 4D:
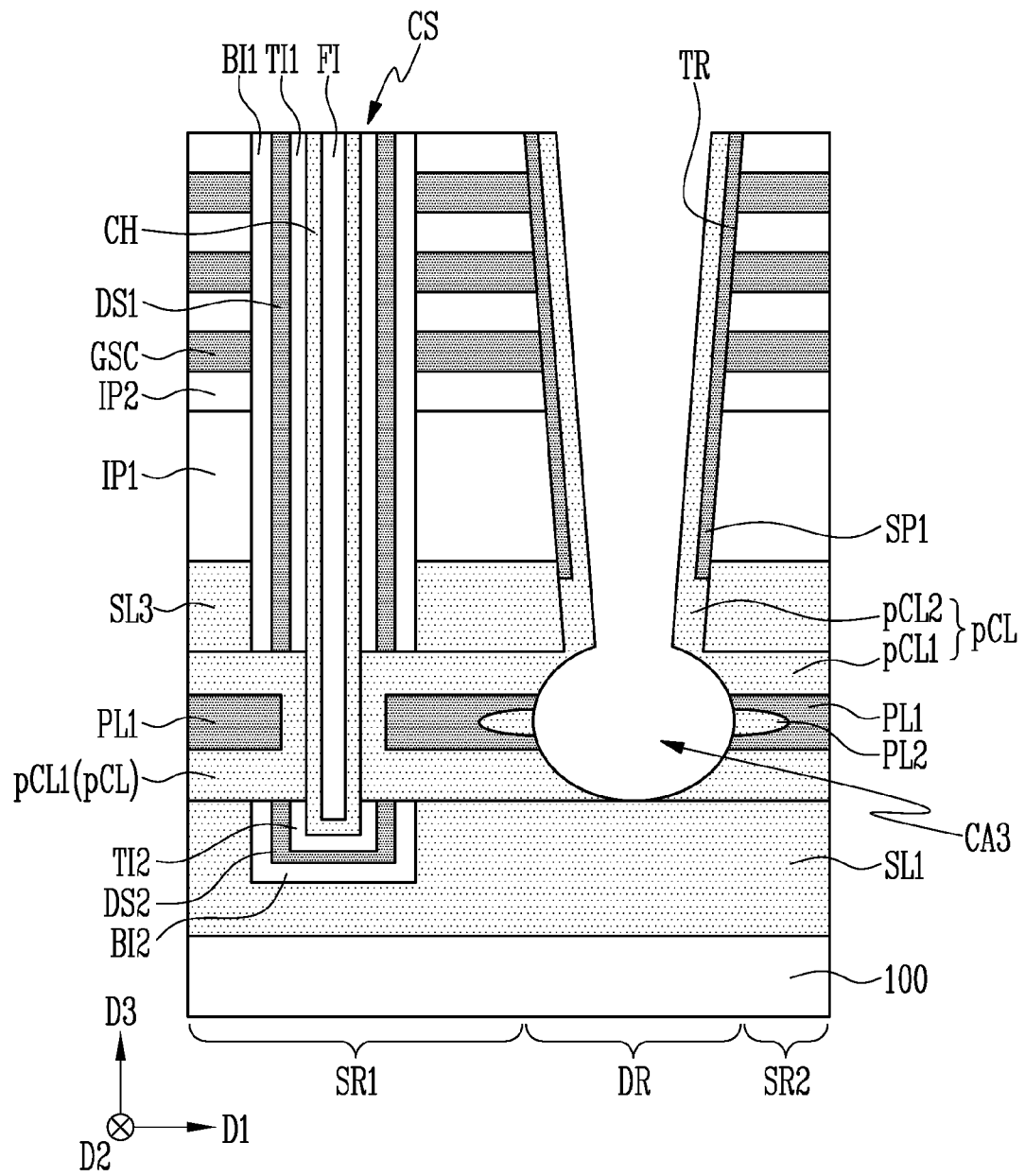

Referring to FIG. 4D, the barrier oxide layer BO may be removed. When the barrier oxide layer BO is removed, the preliminary conductive layer pCL may be again exposed. When the barrier oxide layer BO is removed, a third cavity CA3 may be formed.

Figure 4E:
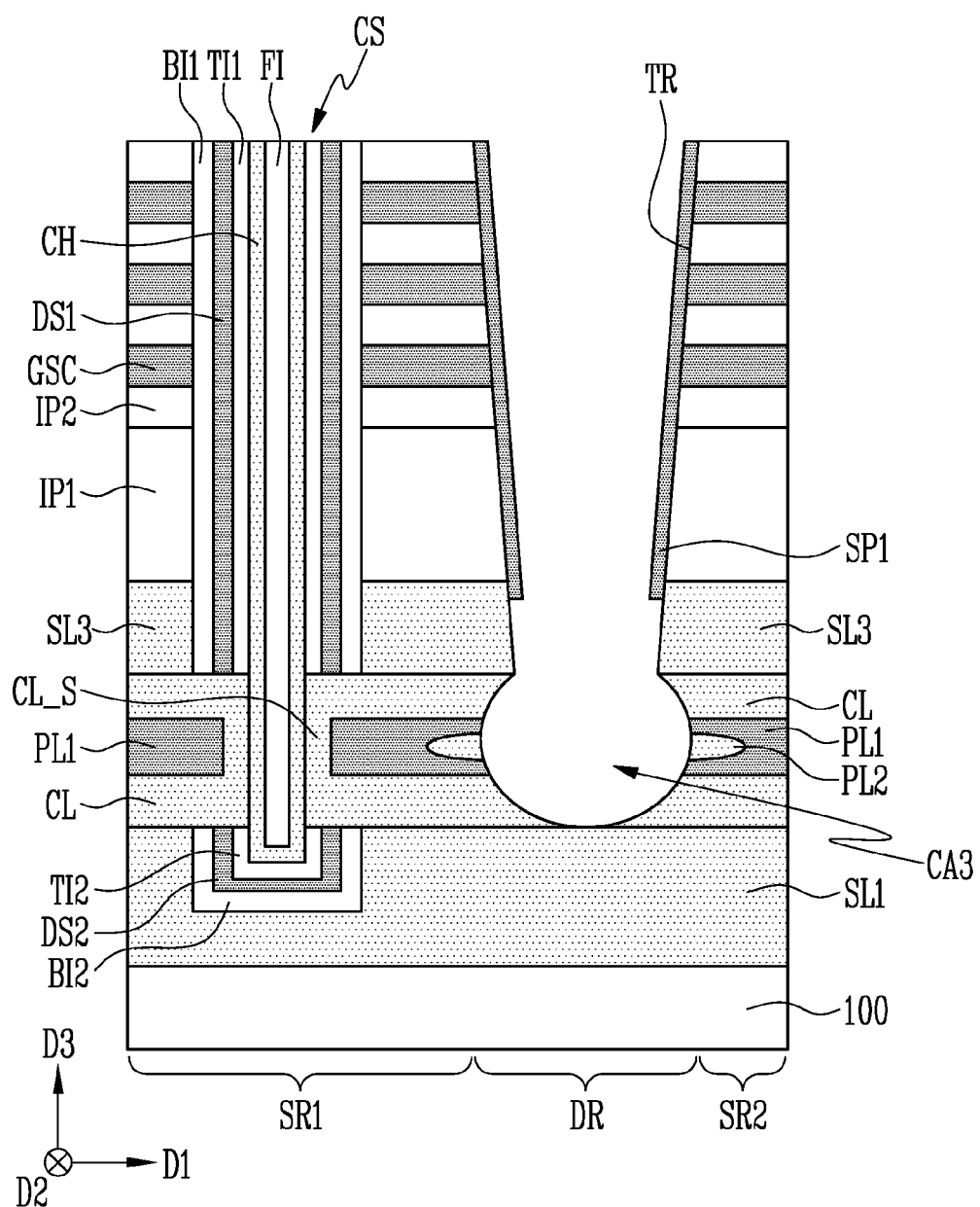

Referring to FIG. 4E, a second preliminary conductive part pCL2 of the preliminary conductive layer pCL may be removed. When the second preliminary conductive part pCL2 is removed, a sidewall of a first spacer layer SP1 may be again exposed.

Subsequently, similarly to as described with reference to FIGS. 2I to 2K, first and second buffer patterns BP1 and BP2 may be formed, the first spacer layer SP1 may be removed, the gate sacrificial layers GSC may be removed, gate patterns GP may be formed, capping patterns CP may be formed, and a common source line 200 may be formed.

In the manufacturing method of the semiconductor memory device in accordance with this embodiment, the first protective layer PL1 and the second protective layer PL2 are formed, so that any air gap is not formed in the conductive layer CL. In accordance with this embodiment, the conductive layer CL is protected by the first protective layer PL1 and the second protective layer PL2. Accordingly, the conductive layer CL can be prevented from being etched by an etchant for etching the second preliminary conductive part pCL2 and an etchant for etching the gate sacrificial layers GSC.

Figure 5:
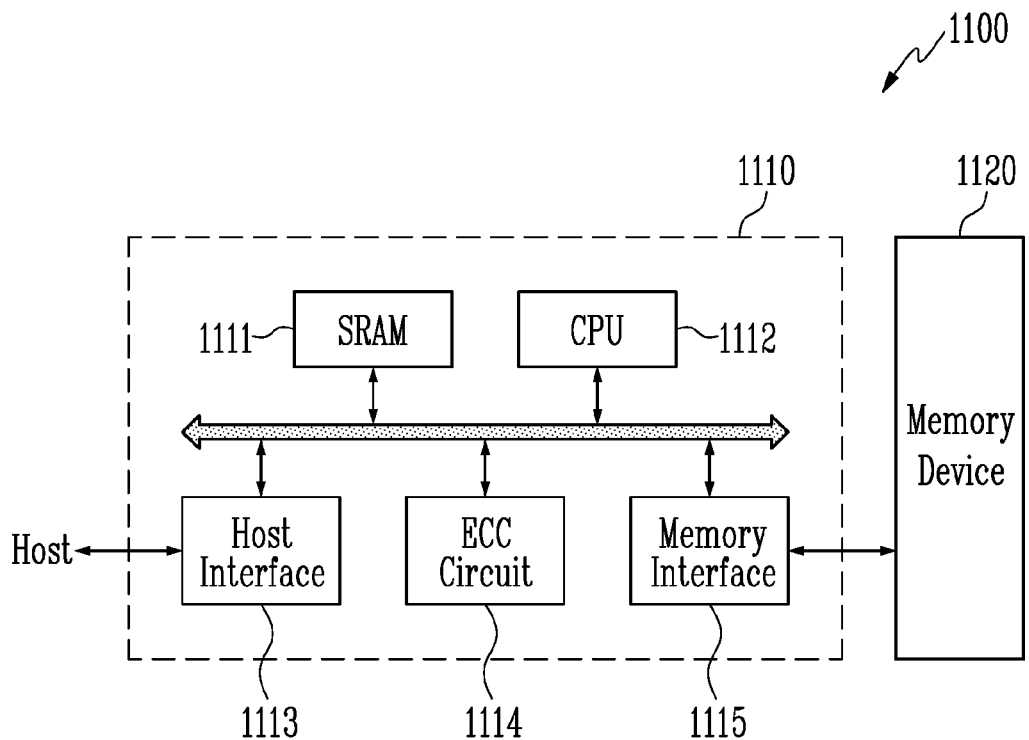
FIG. 5 is a block diagram illustrating a configuration of a memory system in accordance with an embodiment of the present disclosure.

FIG. 5 is a block diagram illustrating a configuration of a memory system 1100 in accordance with an embodiment of the present disclosure.

Referring to FIG. 5, the memory system 1100 includes a memory device 1120 and a memory controller 1110.

The memory device 1120 may include the structure described with reference to FIGS. 1A and 1B or 3. The memory device 1120 may be a multi-chip package configured with a plurality of flash memory chips.

The memory controller 1110 is configured to control the memory device 1120, and may include a Static Random Access Memory (SRAM) 1111, a Central Processing Unit (CPU) 1112, a host interface 1113, an Error Correction Code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 6:
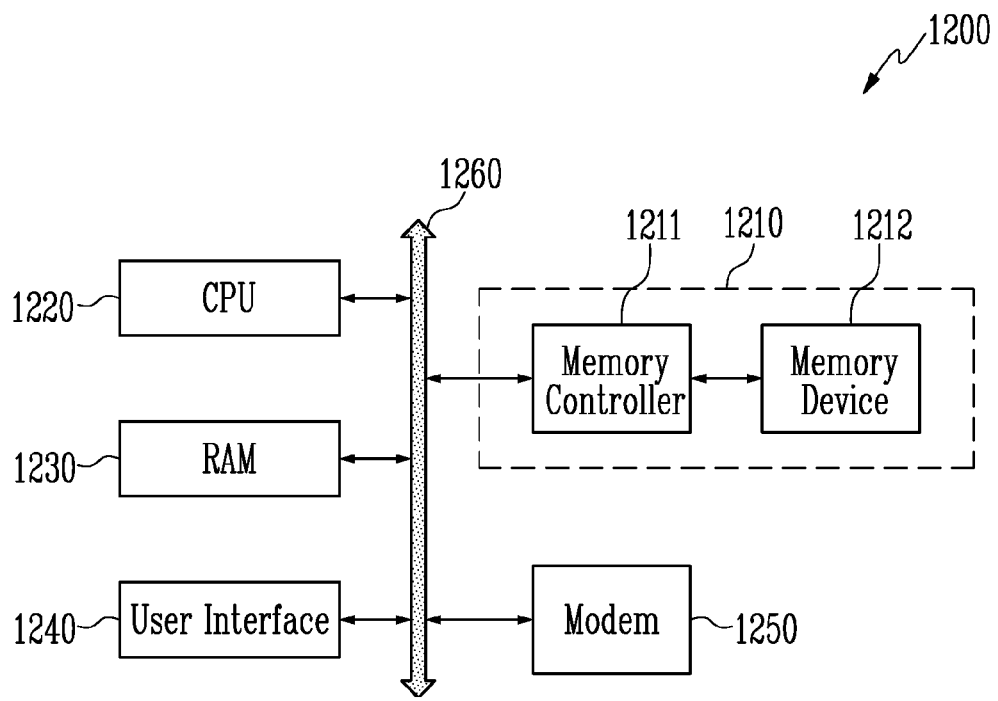
FIG. 6 is a block diagram illustrating a configuration of a computing system in accordance with an embodiment of the present disclosure.

FIG. 6 is a block diagram illustrating a configuration of a computing system 1200 in accordance with an embodiment of the present disclosure.

Referring to FIG. 6, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211 as described with reference to FIG. 5.

In the semiconductor memory device in accordance with the present disclosure, a conductive layer in contact with a channel structure and a barrier layer in the conductive layer can be provided. Accordingly, the operational reliability of the semiconductor memory device can be improved.

While the present disclosure has been illustrated and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or some of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method of manufacturing a semiconductor memory device, the method comprising:
    forming a source structure including a source sacrificial structure;
    forming a stack structure on the source structure;
    forming a trench penetrating the stack structure;
    forming a first cavity by removing the source sacrificial structure through the trench;
    forming a preliminary conductive layer including a first preliminary conductive part in the trench and a second preliminary conductive part in the first cavity;
    forming a first protective layer over the first preliminary conductive part and in a second cavity surrounded by the second preliminary conductive part;
    removing a portion of the first protective layer in the trench and the second cavity to form a third cavity exposing a sidewall of the first protective layer in the second cavity; and
    removing the first preliminary conductive part and a portion of the second preliminary conductive part to expand the third cavity.

2. The method of claim 1, wherein forming the first protective layer includes:
    forming a first preliminary protective part in the trench; and
    forming a second preliminary protective part in the first cavity.

3. The method of claim 2, wherein removing the portion of the first protective layer includes removing the first preliminary protective part.

4. The method of claim 3, wherein removing the first preliminary protective part includes forming an oxidation part by oxidizing the first preliminary protective part.

5. The method of claim 4, wherein removing the first preliminary protective part further includes removing the oxidation part.

6. The method of claim 3, wherein removing the first preliminary protective part includes etching the first preliminary protective part.

7. The method of claim 1, further comprising forming a channel structure penetrating the stack structure.

8. The method of claim 7, wherein the channel structure is formed to include a channel layer in contact with the second preliminary conductive part.

9. A method of manufacturing a semiconductor memory device, the method comprising:
    forming a source sacrificial structure;
    alternately stacking insulating layers and gate sacrificial layers over the source sacrificial structure;
    forming a trench penetrating the insulating layers and the gate sacrificial layers;
    forming a first cavity by removing the source sacrificial structure through the trench;
    forming a source layer including a conductive layer in the first cavity and a protective layer in a second cavity of the conductive layer;
    forming a third cavity in the first cavity by removing a portion of the protective layer in the second cavity, wherein the third cavity is connected to the trench;
    removing the gate sacrificial layers between the insulating layers, wherein the protective layer overlaps each area in which the gate sacrificial layers are removed;
    forming gate patterns between the insulating layers; and
    forming a common source line in the third cavity and the trench, wherein the common source line is coupled to the source layer.

10. The method of claim 9, wherein forming the source layer includes forming a preliminary conductive layer including the second cavity in the first cavity.

11. The method of claim 10, wherein forming the source layer further includes forming a preliminary protective layer in the second cavity.

12. The method of claim 9, further comprising forming a channel structure penetrating the source sacrificial structure, the insulating layers, and the gate sacrificial layers.

13. The method of claim 9, wherein forming the source layer includes:
    forming a preliminary conductive layer including a first preliminary conductive part in the first cavity and a second preliminary conductive part in the trench; and
    forming a preliminary protective layer in the preliminary conductive layer.

14. The method of claim 13, wherein forming the preliminary protective layer includes forming a first preliminary protective part in the first cavity and a second preliminary protective part in the trench.

15. The method of claim 14, wherein forming the source layer further includes removing the second preliminary protective part.

16. The method of claim 15, wherein removing the second preliminary protective part includes forming an oxidation part by oxidizing the second preliminary protective part.

17. The method of claim 16, wherein removing the second preliminary protective part further includes removing the oxidation part.

18. The method of claim 15, wherein removing the second preliminary protective part includes etching the second preliminary protective part.

* * * * *